US011758660B2

(12) United States Patent
Nakayama et al.

(10) Patent No.: US 11,758,660 B2
(45) Date of Patent: *Sep. 12, 2023

(54) CONDUCTIVE MEMBER FOR TOUCH PANEL AND TOUCH PANEL

(71) Applicant: FUJIFILM Corporation, Tokyo (JP)

(72) Inventors: Masaya Nakayama, Kanagawa (JP); Tadashi Kuriki, Kanagawa (JP); Reona Ikeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/667,937

(22) Filed: Feb. 9, 2022

(65) Prior Publication Data

US 2022/0171503 A1 Jun. 2, 2022

Related U.S. Application Data

(63) Continuation of application No. 16/710,364, filed on Dec. 11, 2019, now Pat. No. 11,284,514, which is a
(Continued)

(30) Foreign Application Priority Data

Jul. 27, 2017 (JP) .................................. 2017-145673

(51) Int. Cl.
*G06F 3/044* (2006.01)
*H05K 1/11* (2006.01)
(Continued)

(52) U.S. Cl.
CPC ........... *H05K 1/119* (2013.01); *G06F 3/0448* (2019.05); *H05K 3/0014* (2013.01); *H05K 3/28* (2013.01);
(Continued)

(58) Field of Classification Search
CPC ... G06F 3/044–047; G06F 2203/04103; G06F 2203/04107;
(Continued)

(56) References Cited

U.S. PATENT DOCUMENTS 10,254,904 B2 4/2019 Satou
2012/0075238 A1 3/2012 Minami et al.
(Continued)

FOREIGN PATENT DOCUMENTS

CN 104635976 A 5/2015
CN 106170751 A 11/2016
(Continued)

OTHER PUBLICATIONS

International Search Report Issued in PCT/JP2018/025178 dated Aug. 14, 2018.
(Continued)

*Primary Examiner* — Roberto W Flores
(74) *Attorney, Agent, or Firm* — Edwards Neils LLC; Jean C. Edwards, Esq.

(57) ABSTRACT

A conductive member for a touch panel includes a transparent insulating member; and a plurality of first electrodes extending in a first direction and arranged in parallel in a second direction intersecting the first direction, in which the plurality of first electrodes are constituted by a first mesh conductive film a plurality of fine metal wires are electrically connected, the plurality of first electrodes include a plurality of first main electrodes each having an electrode width Wa defined in the second direction and at least one first sub-electrode having an electrode width Wb smaller than Wa of the first main electrode in the second direction, the first sub-electrode is the first electrode arranged on an outermost side among the plurality of first electrodes, an opening ratio of the first sub-electrode is smaller than that of
(Continued)

the first main electrode, and the first main electrode has a first dummy pattern.

13 Claims, 6 Drawing Sheets

Related U.S. Application Data continuation of application No. PCT/JP2018/025178, filed on Jul. 3, 2018.

(51) Int. Cl.
*H05K 3/00* (2006.01)
*H05K 3/28* (2006.01)

(52) U.S. Cl.
CPC .......... *G06F 3/0445* (2019.05); *G06F 3/0446* (2019.05); *G06F 2203/04112* (2013.01)

(58) Field of Classification Search
CPC .............. G06F 2203/04111–04113; G06F 2203/04112; G06F 3/0448; G06F 3/0445; G06F 3/0446; G06F 3/041–047; H05K 1/119; H05K 3/0014; H05K 3/28; H01B 5/14

See application file for complete search history.

(56) References Cited

U.S. PATENT DOCUMENTS

| | | |
|---|---|---|
| 2014/0333555 A1 | 11/2014 | Oh et al. |
| 2015/0116252 A1 | 4/2015 | Park et al. |
| 2015/0122625 A1 | 5/2015 | Seo |
| 2015/0177872 A1 | 6/2015 | Kim et al. |
| 2016/0103526 A1 | 4/2016 | Sohn |
| 2017/0010720 A1 | 1/2017 | Nakayama |
| 2017/0102342 A1 | 4/2017 | Iwami |
| 2017/0177120 A1 | 6/2017 | Kyutoku et al. |
| 2017/0200263 A1 | 7/2017 | Iwami |
| 2017/0220163 A1* | 8/2017 | Kurasawa ........... G06F 3/04166 |
| 2018/0120971 A1* | 5/2018 | Lee ........................ G06F 3/0446 |
| 2019/0004657 A1* | 1/2019 | Koudo .................... G06F 3/047 |

FOREIGN PATENT DOCUMENTS

| | | |
|---|---|---|
| JP | 2012-073783 A | 4/2012 |
| JP | 2014-010671 A | 1/2014 |
| JP | 2014-203203 A | 10/2014 |
| JP | 2015-108884 A | 6/2015 |

OTHER PUBLICATIONS

Written Opinion Issued in PCT/JP2018/025178 dated Aug. 14, 2018.
International Preliminary Report on Patentability Issued in PCT/JP2018/025178 dated Jan. 28, 2020.
Office Action, issued by the Japanese Patent Office dated Dec. 1, 2020, in connection with Japanese Patent Application No. 2019-532469.
Non-Final Office Action issued in U.S. Appl. No. 16/710,364 dated Feb. 4, 2021.
Final Office Action issued in U.S. Appl. No. 16/710,364 dated Jul. 28, 2021.
Office Action, issued by the Taiwanese Patent Office dated Dec. 29, 2021, in connection with Taiwanese Patent Application No. 107124346.
Office Action, issued by the State Intellectual Property Office dated Jan. 20, 2023, in connection with Chinese Patent Application No. 201880044945.X.

* cited by examiner

CONDUCTIVE MEMBER FOR TOUCH PANEL AND TOUCH PANEL

CROSS-REFERENCE TO RELATED APPLICATIONS

This application is a Continuation of U.S. Application Ser. No. 16/710,364 filed on Dec. 11, 2019, which is a Continuation of PCT International Application No. PCT/JP2018/025178 filed on Jul. 3, 2018, which claims priority under 35 U.S.C § 119(a) to Japanese Patent Application No. 2017-145673 filed on 2017 Jul. 27. Each of the above application(s) is hereby expressly incorporated by reference, in its entirety, into the present application.

BACKGROUND OF THE INVENTION

1. Field of the Invention

The present invention relates to a conductive member for a touch panel.

The present invention also relates to a touch panel obtained using a conductive member.

2. Description of the Related Art

In recent years, in various electronic devices including portable information devices such as tablet computers and smart phones, a touch panel which is used in combination with display devices such as liquid crystal display devices and which performs an input operation on an electronic device by causing members such as fingers and stylus pens to be in contact with or be close to a screen is in widespread.

In the touch panel, a conductive member in which a detection portion for detecting a touch operation by causing members such as fingers and stylus pens to be in contact with or be close to a screen is formed on a transparent substrate is used.

The detection portion is formed of a transparent conductive oxide such as Indium Tin Oxide (ITO), but is also formed of metal other than the transparent conductive oxide. Compared to the above transparent conductive oxide, metal has advantages such as easy patterning, excellent flexibility, and a lower resistance value. For example, in a touch panel having a conductive member constituted using a fine metal wire, it is possible to reduce a resistance value and a parasitic capacitance value compared to a touch panel of the related art configured using a transparent conductive oxide, and thus it is possible to improve detection sensitivity for a touch operation and this touch panel attracts attention.

JP2012-073783A discloses a conductive member having a plurality of first electrodes extending in a first direction and arranged in parallel in a second direction intersecting the first direction, and a plurality of second electrodes extending in the second direction and arranged in parallel in the first direction. The plurality of first electrodes and the plurality of second electrodes are arranged to be overlapped with each other via a transparent insulating member. Further, it is disclosed that in order to improve a uniformity of detection sensitivity, an electrode width of the first electrode arranged on the outermost side in the second direction among the plurality of first electrodes is set to be smaller than an electrode width of each of the plurality of first electrodes arranged on the inner side.

In addition, JP2014-203203A discloses a conductive member having a plurality of first electrodes extending in a first direction and arranged in parallel in a second direction intersecting the first direction, and a plurality of second electrodes and a plurality of third electrodes extending in the second direction and arranged in parallel in the first direction. The plurality of second electrodes and the plurality of third electrodes are arranged to be overlapped with the plurality of the first electrodes via the transparent insulating substrate. In addition, the plurality of third electrodes are each arranged between the plurality of second electrodes. In addition, the plurality of first electrodes, second electrodes, and third electrodes are each a mesh-like electrode constituted by a plurality of fine metal wires. Further, in order to form a uniform mesh pattern in a case where the plurality of first electrodes are overlapped with the plurality of second electrodes and the plurality of third electrodes, the third electrode includes a portion having a smaller mesh pitch than a mesh pitch of the second electrode and a portion having the same mesh pitch as a mesh pitch of the second electrode.

SUMMARY OF THE INVENTION

However, in the touch panel disclosed in JP2012-073783A, a conductive member constituted using a fine metal wire that can be expected to have high detection sensitivity for an electrode pattern is employed, but it is not possible to obtain the touch panel having high detection sensitivity and an excellent uniformity of detection sensitivity.

Moreover, the third electrode in JP2014-203203A includes a portion having the same mesh pitch as a mesh pitch of the second electrode, but in this portion, the number of intersections of fine metal wires is not sufficiently ensured compared to regions of other second electrodes. As a result, in a case w % here the fine metal wire is disconnected, the resistance value may be remarkably increased. Therefore, in a case where the touch panel disclosed in JP2014-203203A is used, a uniformity of detection sensitivity over a touch surface of the touch panel may be decreased.

The present invention is made in order to solve such problems in the related art, and an object thereof is to provide a conductive member for a touch panel capable of improving detection sensitivity for a touch operation and a uniformity of detection sensitivity in a case where it is used for a touch panel.

In addition, another object of the present invention is to provide a touch panel comprising such a conductive member for a touch panel.

A conductive member for a touch panel according to present invention comprises a transparent insulating member, and a plurality of first electrodes extending in a first direction and arranged in parallel in a second direction intersecting the first direction so as to be insulated from one another on the transparent insulating member, in which the plurality of first electrodes are constituted by a first mesh conductive film in which a plurality of fine metal wires are electrically connected to one another, in which the plurality of first electrodes include a plurality of first main electrodes each having an electrode width Wa defined in the second direction and at least one first sub-electrode having an electrode width Wb smaller than the electrode width Wa of the first main electrode in the second direction, and in which over an entire region of the first sub-electrode, a mesh pitch Pb of the first mesh conductive film constituting the first sub-electrode in the second direction is smaller than a mesh pitch Pa of the first mesh conductive film constituting the first main electrode in the second direction.

The first sub-electrode is preferably arranged on an outermost side among the plurality of first electrodes.

In addition, the mesh pitch Pb and the electrode width Wb preferably satisfy the following Expression (1).

$$1.5Pb \leq Wb \quad (1)$$

In addition, the mesh pitch Pa and the electrode width Wb preferably satisfy the following Expression (2).

$$Wb < 1.5Pa \quad (2)$$

In addition, the first mesh conductive film may be constituted by a rhombus mesh, and the mesh pitch Pa and the mesh pitch Pb may satisfy the following Expression (3).

$$Pa = 2Pb \quad (3)$$

In addition, the first mesh conductive film can be constituted by a plurality of mesh cells, a length of a side of the mesh cell included in the first mesh conductive film constituting the first main electrode can have a value of −10% or more and +10% or less with respect to an average value of lengths of sides of the plurality of mesh cells of the first main electrode, and a length of a side of the mesh cell included in the first mesh conductive film constituting the first sub-electrode can have a value of −10% or more and +10% or less with respect to an average value of lengths of sides of the plurality of mesh cells of the first sub-electrode.

In addition, the first main electrode can have a first dummy pattern, which is arranged so as to be electrically insulated from the first mesh conductive film and is constituted by a plurality of fine metal wires.

In addition, a difference between an opening ratio of the first main electrode and an opening ratio of the first sub-electrode is preferably within 0.5%.

In addition, the conductive member for a touch panel can further comprise a plurality of first dummy electrodes each of which is arranged between the plurality of first electrodes so as to be electrically insulated from the plurality of first electrodes and each of which is constituted by a plurality of fine metal wires.

Furthermore, a difference between any two of an opening ratio of the first main electrode, an opening ratio of the first sub-electrode, and an opening ratio of the first dummy electrode is preferably within 0.5%, respectively.

In addition, the conductive member for a touch panel preferably further comprises a plurality of second electrodes extending in the second direction and arranged in parallel in the first direction so as to be insulated from one another, in which the plurality of first electrodes and the plurality of second electrodes are preferably arranged so as to be insulated from each other, in which the plurality of second electrodes are constituted by a second mesh conductive film in which a plurality of fine metal wires are electrically connected to one another, in which the plurality of second electrodes preferably include a plurality of second main electrodes each having an electrode width Wc defined in the first direction and at least one second sub-electrode having an electrode width Wd smaller than the electrode width Wc of the second main electrode in the first direction, and in which over an entire region of the second sub-electrode, a mesh pitch Pd of the second mesh conductive film constituting the second sub-electrode in the first direction is preferably smaller than a mesh pitch Pc of the second mesh conductive film constituting the second main electrode in the first direction.

In addition, the second sub-electrode is preferably the second electrode arranged on an outermost side among the plurality of second electrodes.

In addition, the mesh pitch Pd and the electrode width Wd preferably satisfy the following Expression (4).

$$1.5Pd \leq Wd \quad (4)$$

In addition, the mesh pitch Pc and the electrode width Wd preferably satisfy the following Expression (5).

$$Wd < 1.5Pc \quad (5)$$

In addition, the second mesh conductive film may be constituted by a rhombus mesh, and the mesh pitch Pc of the second main electrode and the mesh pitch Pd of the second sub-electrode may satisfy the following Expression (6).

$$Pc = 2Pd \quad (6)$$

In addition, the second mesh conductive film can be constituted by a plurality of mesh cells, a length of a side of the mesh cell included in the second mesh conductive film constituting the second main electrode can have a value of −10% or more and +10% or less with respect to an average value of lengths of sides of the plurality of mesh cells of the second main electrode, and a length of a side of the mesh cell included in the second mesh conductive film constituting the second sub-electrode can have a value of −10% or more and +10% or less with respect to an average value of lengths of sides of the plurality of mesh cells of the second sub-electrode.

In addition, the second mesh conductive film preferably has the same mesh shape as a mesh shape of the first mesh conductive film.

In addition, the second main electrode can have a second dummy pattern, which is arranged so as to be electrically insulated from the second mesh conductive film and is constituted by a plurality of fine metal wires.

In addition, a difference between an opening ratio of the second main electrode and an opening ratio of the second sub-electrode is preferably within 0.5%.

In addition, the conductive member for a touch panel can further comprise a plurality of second dummy electrodes each of which is arranged between the plurality of second electrodes so as to be electrically insulated from the plurality of second electrodes and each of which is constituted by a plurality of fine metal wires.

In addition, a difference between any two of an opening ratio of the second main electrode, an opening ratio of the second sub-electrode, and an opening ratio of the second dummy electrode is preferably within 0.5%, respectively.

A touch panel according to the embodiment of the present invention is a touch panel obtained by using the conductive member.

According to present invention, a conductive member for a touch panel comprises a plurality of first electrodes in which a plurality of fine metal wires are electrically connected to one another and which is constituted by a first mesh conductive film, the plurality of first electrodes include a plurality of first main electrodes each having an electrode width Wa defined in the second direction and at least one first sub-electrode having an electrode width Wb smaller than the electrode width Wa of the first main electrode in the second direction, and over an entire region of the first sub-electrode, a mesh pitch Pb of the first mesh conductive film constituting the first sub-electrode in the second direction is smaller than a mesh pitch Pa of the first mesh conductive film constituting the first main electrode in the second direction. Therefore, in a case where the conductive member for a touch panel of the present invention is used for a touch panel, it is possible to improve detection sensitivity with respect to a touch operation and to improve a uniformity of detection sensitivity.

DESCRIPTION OF THE PREFERRED EMBODIMENTS

Hereinafter, a conductive member according to the present invention will be described in detail based on preferred embodiments shown in the accompanying drawings.

Hereinafter, the expression "to" exhibiting a numerical value range includes numerical values indicated on both sides. For example, "s is a numerical value t1 to a numerical value t2" means that the range of s is a range including the numerical value t1 and the numerical value t2, and in a case of indicating by using mathematical symbols, t1≤s≤t2.

Unless otherwise described, an angle including "orthogonal", "parallel" and the like includes error ranges generally accepted in the art.

"Transparent" means that a light transmittance is at least 40% or more, preferably 75% or more, more preferably 80% or more, and even more preferably 90% or more with respect to the visible light wavelength range of 400 to 800 nm. The light transmittance is measured by using "plastic—a method of obtaining total light transmittance and total light reflectance" regulated in JIS K 7375:2008.

Embodiment 1

Figure 1:
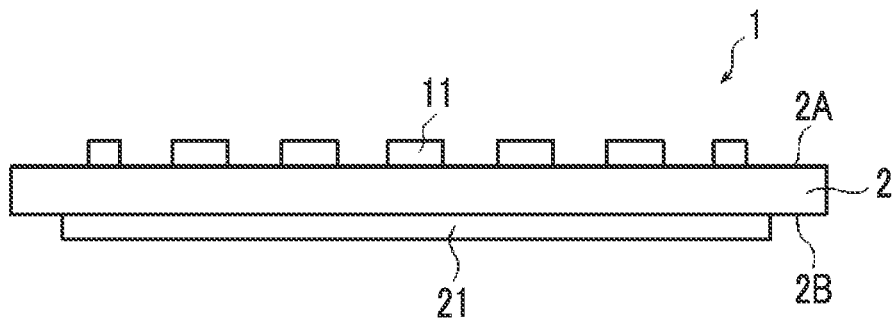
FIG. 1 is a cross section view of a conductive member according to Embodiment 1 of the present invention.

FIG. 1 is a cross section view showing a conductive member 1 according to Embodiment 1. As shown in FIG. 1, the conductive member 1 has a transparent insulating substrate 2 that is a transparent insulating member, and the transparent insulating substrate 2 has a front surface 2A and a back surface 2B. A plurality of first electrodes 11 are formed on the front surface 2A of the transparent insulating substrate 2, and a plurality of second electrodes 21 are formed on the back surface 2B of the transparent insulating substrate 2 as described later.

Figure 2:
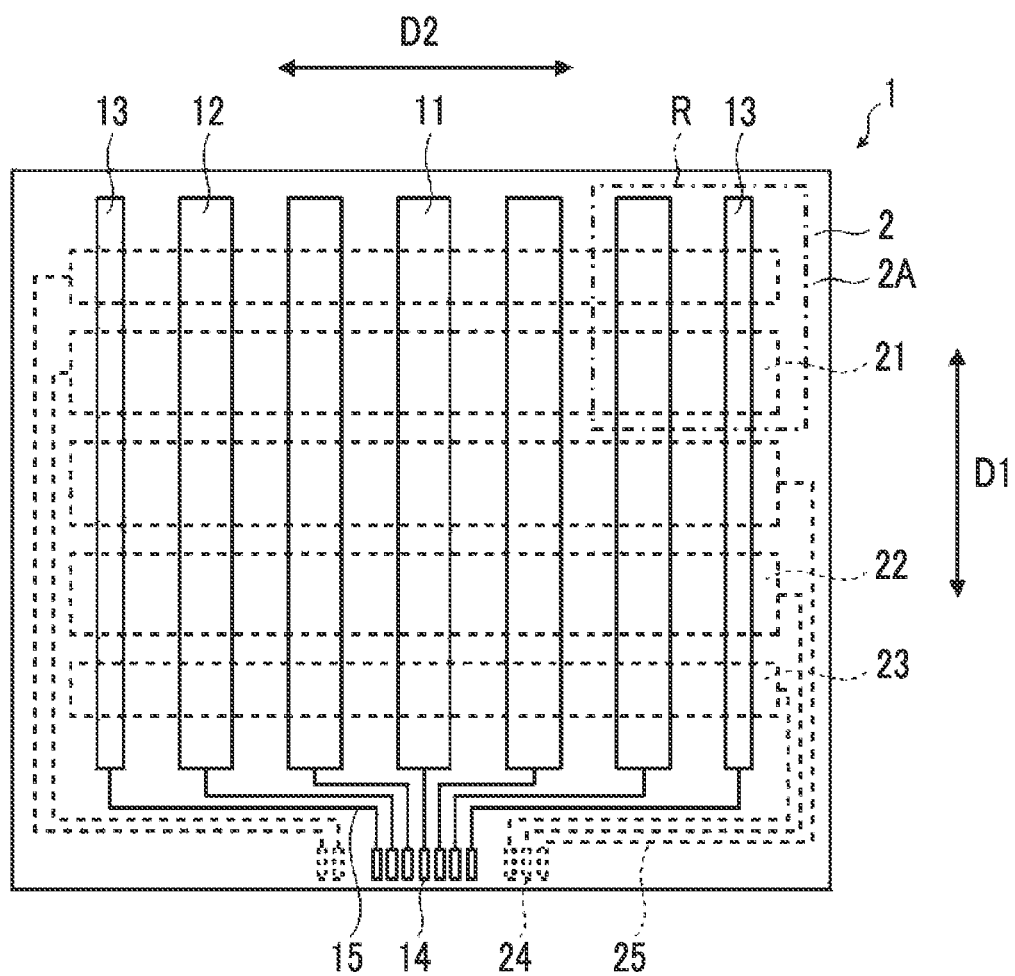
FIG. 2 is a plan view of the conductive member according to Embodiment 1.

FIG. 2 is a plan view showing the conductive member 1 according to Embodiment 1. As shown in FIG. 2, the plurality of first electrodes 11 extend in a first direction D1 and are arranged in parallel at intervals therebetween in a second direction D2 intersecting the first direction D1 so as to be insulated from one another. In addition, the plurality of first electrodes 11 arranged in parallel in the second direction D2 include a plurality of first main electrodes 12 and a pair of first sub-electrodes 13 arranged on the outermost side.

In addition, a plurality of first external connection terminals 14 are formed in an edge part of the front surface 2A of the transparent insulating substrate 2, and the plurality of first external connection terminals 14 and the plurality of first electrodes 11 are electrically connected to each other by a plurality of first edge part wires 15, respectively.

The plurality of second electrodes 21 extend in the second direction D2 and are arranged at intervals therebetween in the first direction D1 so as to be insulated from one another. In addition, the plurality of second electrodes 21 arranged in parallel in the first direction D1 include a plurality of second main electrodes 22 and a pair of second sub-electrodes 23 arranged on the outermost side. In addition, a plurality of second external connection terminals 24 are formed in an edge part of the back surface 2B of the transparent insulating substrate, and the plurality of second external connection terminals 24 and the plurality of second electrodes 21 are electrically connected to each other by a plurality of second edge part wires 25, respectively.

Further, although not shown, the first electrode 11 and the first edge part wire 15 may be connected to each other via an electrode terminal, and the second electrode 21 and the second edge part wire 25 may be connected to each other via an electrode terminal. Regarding a shape of this electrode terminal, for example, a shape disclosed in JP2013-127657A can be used.

Figure 3:
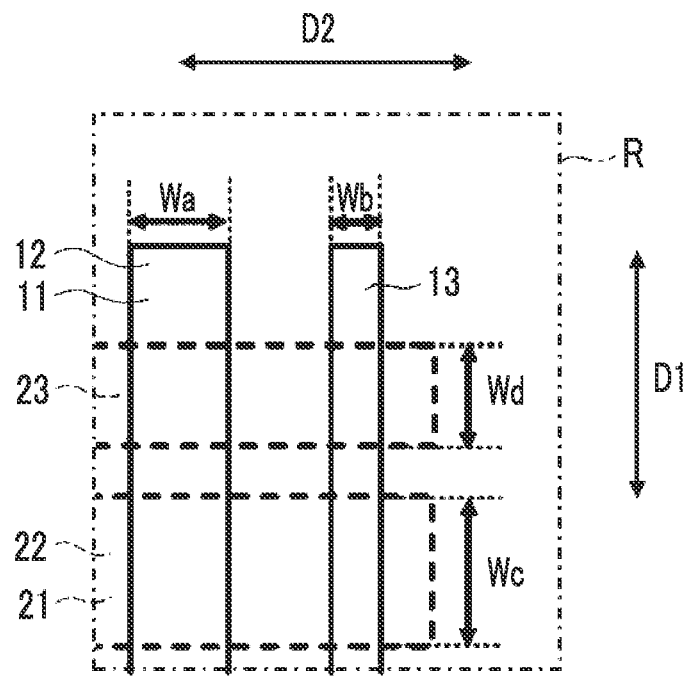
FIG. 3 is a partially enlarged plan view of the conductive member according to Embodiment 1.

FIG. 3 shows a planar portion obtained by enlarging a corner portion R of the conductive member 1. As shown in FIG. 3, the first main electrode 12 of the first electrode 11 has an electrode width Wa defined in the second direction D2, and the first sub-electrode 13 has an electrode width Wb smaller than the electrode width Wa of the first main electrode 12 in the second direction D2. In addition, the second main electrode 22 of the second electrode 21 has an electrode width Wc defined in the first direction D1, and the second sub-electrode 23 has an electrode width Wd smaller than the electrode width Wc of the second main electrode 22 in the first direction D1.

By arranging the first sub-electrode 13 and the second sub-electrode 23 in this manner, in the first electrode 11 on the outermost side in the second direction D2 among the plurality of first electrodes 11 and the second electrode 21 on the outermost side in the first direction D1 among the plurality of second electrodes 21, it is possible to make a parasitic capacitance uniform for each electrode. Thereby, in a case where the conductive member 1 is used for a touch panel, detection sensitivity of an edge of a touch region of the touch panel can be improved, and a uniformity of detection sensitivity over a touch surface can be improved.

Further, as shown in FIG. 3, the electrode width Wa of the first main electrode 12 of the first electrode 11 is smaller than the electrode width WC of the second main electrode 22 of the second electrode 21, and the electrode width Wb of the first sub-electrode 13 of the first electrode 11 is smaller than the electrode width Wd of the second sub-electrode 23 of the second electrode 21. Here, in a case where the conductive member 1 is used for the touch panel and the plurality of first electrodes 11 are arranged on the touch surface side of the touch panel, by making the electrode widths Wc and Wd of the plurality of second electrodes 21 larger than the electrode widths Wa and Wb of the plurality of first electrodes 11, respectively, it is possible to make resistance values of the plurality of second electrodes 21 that are distant from the touch surface smaller than the resistance values of the plurality of first electrodes 11 that are close to the touch surface. In this case, detection sensitivity with respect to a touch operation can be improved.

Figure 4:
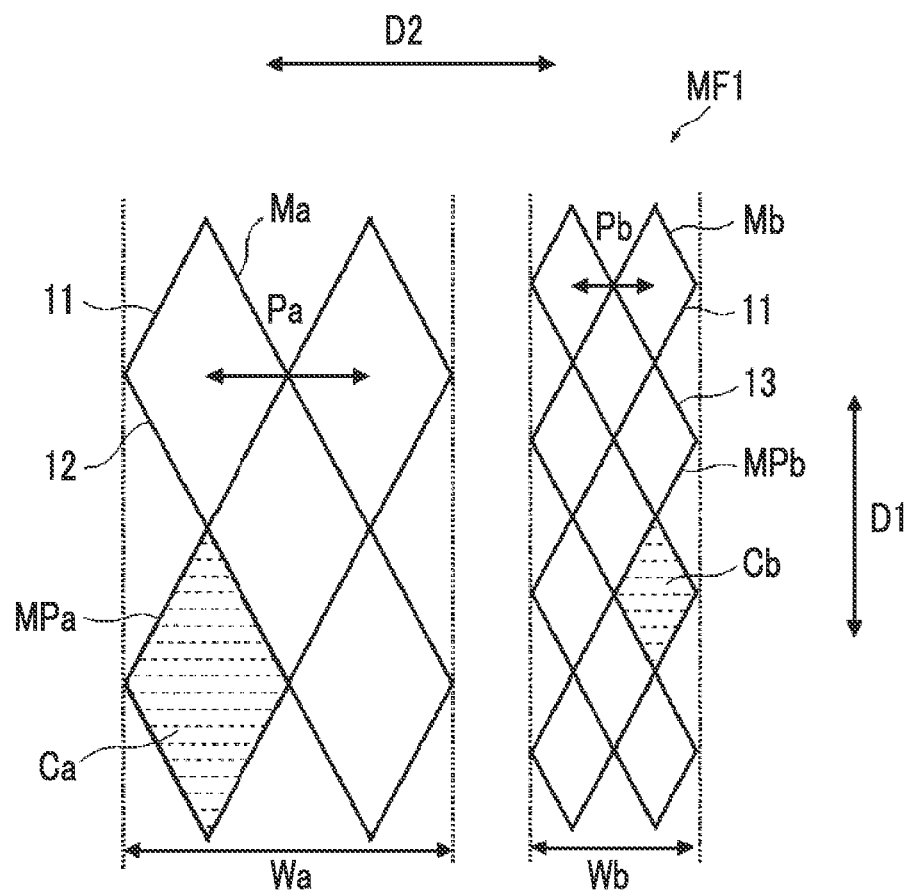
FIG. 4 is a partially enlarged plan view of a first main electrode and a first sub-electrode in Embodiment 1.

FIG. 4 shows a partially enlarged plan view of the first main electrode 12 and the first sub-electrode 13 of the first electrode 11 at the corner portion R of the conductive member 1. The plurality of first electrodes 11 are constituted by a first mesh conductive film MF1 having a first conductive mesh pattern MPa and a second conductive mesh pattern MPb. As shown in FIG. 4, the first main electrode 12 of the first electrode 11 is constituted by a first conductive mesh pattern MPa in which a plurality of fine metal wires Ma are electrically connected to one another. The first conductive mesh pattern MPa is constituted by a rhombus mesh, and has a plurality of rhombus mesh cells Ca. Further, a mesh pitch Pa of the first conductive mesh pattern MPa constituting the first main electrode 12 is determined by a distance in the second direction D2 between the centroids of the mesh cells Ca adjacent to each other in the second direction D2. Here, the mesh cell refers to one unit region constituting a mesh shape, and the mesh shape is constituted by a plurality of mesh cells.

Further, the first sub-electrode 13 of the first electrode 11 is constituted by a second conductive mesh pattern MPb in which a plurality of fine metal wires Mb are electrically connected to one another. The second conductive mesh pattern MPb is constituted by a rhombus mesh, and has a plurality of rhombus mesh cells Cb. Further, a mesh pitch Pb of the second conductive mesh pattern MPb constituting the first sub-electrode 13 is determined by a distance in the second direction D2 between the centroids of the mesh cells Cb adjacent to each other in the second direction D2.

As described above, since the plurality of first electrodes 11 are constituted by the first mesh conductive film MF1 constituted by the fine metal wires Ma and Mb, it is possible to reduce a resistance value and a parasitic capacitance more than an electrode constituted by a transparent conductive oxide such as ITO. Therefore, in a case where the conductive member 1 including the plurality of first electrodes 11 is used for a touch panel, it is possible to obtain a touch panel with high detection sensitivity.

In addition, over the entire region of the first sub-electrode 13, the mesh pitch Pb of the second conductive mesh pattern MPb constituting the first sub-electrode 13 is smaller than the mesh pitch Pa of the first conductive mesh pattern MPa constituting the first main electrode 12. Therefore, the number of intersections of the plurality of fine metal wires Mb in the first sub-electrode 13 can be sufficiently ensured, and the number of the fine metal wires Mb connecting a plurality of the intersections to one another can be sufficiently ensured. Thereby, in the first sub-electrode 13, the number of conductive paths can be sufficiently ensured, and thus even though a partial disconnection occurs in the plurality of fine metal wires Mb constituting the first sub-electrode 13, an influence due to the disconnection can be reduced, and an increase in the resistance value of the first sub-electrode 13 can be suppressed.

In addition, the preferable value of the mesh pitch Pa is 500 μm or more and 2000 μm or less, and the preferable value of the mesh pitch Pb is 250 μm or more and 1000 μm or less. It is possible to obtain a touch panel with high detection sensitivity by setting the mesh pitches Pa and Pb to a mesh pitch in the above range. In addition, the mesh pitch Pa is more preferably 700 μm or more, and still more preferably 800 μm or more. Furthermore, the mesh pitch Pa is more preferably less than 1600 μm, and still more preferably less than 1400 μm. In addition, the mesh pitch Pb is more preferably 350 μm or more, and still more preferably 400 μm or more. Furthermore, the mesh pitch Pb is more preferably less than 800 μm, and still more preferably less than 700 μm.

Further, a preferable range in a relationship between the mesh pitch Pa and the mesh pitch Pb is $1.2Pb \leq Pa \leq 5Pb$ from a viewpoint of detection sensitivity of the touch panel, a more preferable range is $1.5Pb \leq Pa \leq 4Pb$, and a particularly preferable range is $Pa=2Pb$.

Figure 5:
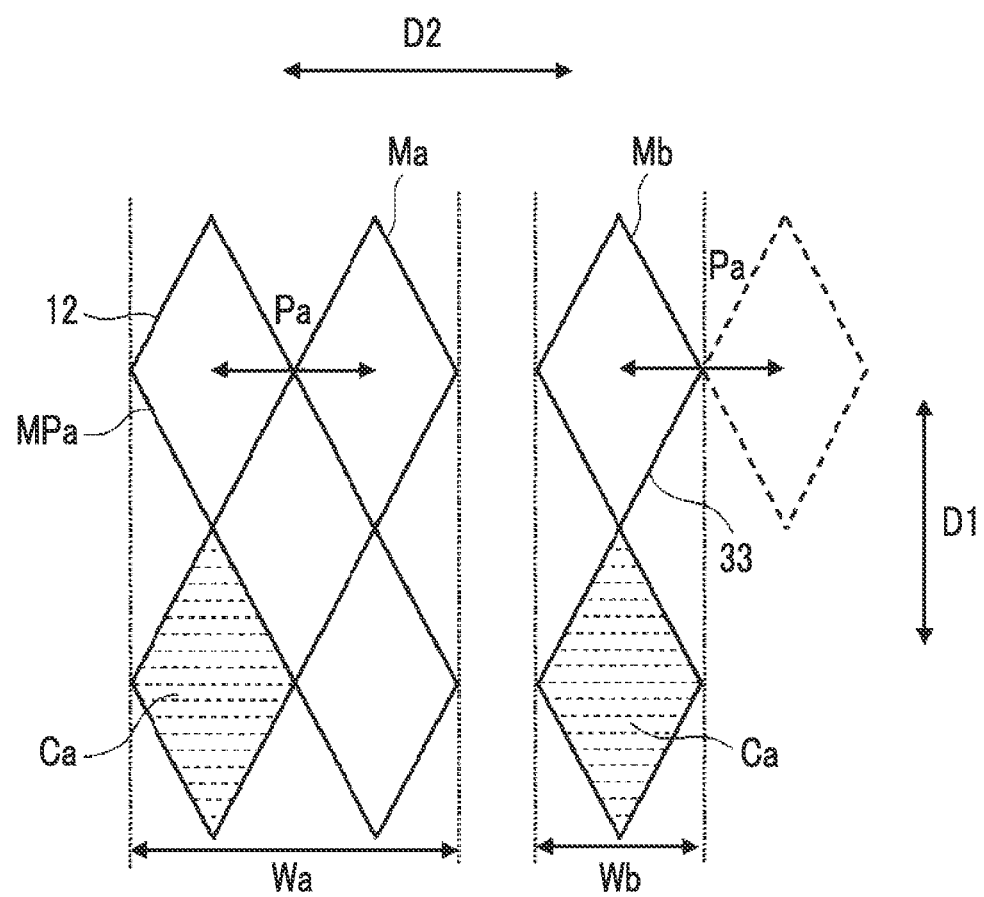
FIG. 5 is a diagram showing an example of an electrode of the related art.

Here, for example, as shown in FIG. 5, in a case where a first sub-electrode 33 has the same mesh pitch Pa as the mesh pitch Pa of the first main electrode 12 and the same mesh cell Ca as the mesh cell Ca included in the first main electrode 12, the number of conductive paths included in the first sub-electrode 33 cannot be sufficiently ensured. Thereby, in a case where a disconnection occurs in the fine metal wires Mb constituting the plurality of first sub-electrodes 33, an influence of the disconnection is large, and a resistance value of the first sub-electrode 33 in which the disconnection occurs significantly increases.

Thus, the first sub-electrode 13 in Embodiment 1 is hard to receive the influence due to the disconnection, and can suppress an increase of the resistance value. Therefore, by using the conductive member 1 having the plurality of first electrodes 11 including the pair of first sub-electrodes 13 for the touch panel, it is possible to improve a uniformity of detection sensitivity with respect to the touch operation over the touch surface of the touch panel.

Moreover, it is desirable that the mesh pitch Pb of the second conductive mesh pattern MPb constituting the first sub-electrode 13 and the electrode width Wb of the first sub-electrode 13 satisfy the following Expression (1).

$$1.5Pb \leq Wb \tag{1}$$

By satisfying Expression (1), it is possible to sufficiently ensure the number of conductive paths in the first sub-electrode 13 having the electrode width Wb, and in a case where the conductive member 1 is used for a touch panel, detection sensitivity and a uniformity of detection sensitivity of the touch panel can be improved.

Moreover, it is desirable that the mesh pitch Pa of the first conductive mesh pattern MPa constituting the first main electrode 12 and the electrode width Wb of the first sub-electrode 13 satisfy the following Expression (2).

$$Wb < 1.5Pa \tag{2}$$

By satisfying Expression (2), it is possible to sufficiently reduce the electrode width Wb of the first sub-electrode 13, and thus it is possible to reduce the parasitic capacitance in the first sub-electrode 13, and in a case where the conductive member 1 is used for a touch panel, detection sensitivity and a uniformity of detection sensitivity of the touch panel can be further improved.

Moreover, it is desirable that the mesh pitch Pa of the first conductive mesh pattern MPa constituting the first main electrode 12 and the mesh pitch Pb of the second conductive mesh pattern MPb constituting the first sub-electrode 13 satisfy the following Expression (3).

$$Pa=2Pb \tag{3}$$

By satisfying Expression (3), detection sensitivity of a touch panel can be improved.

Further, a difference between an opening ratio of the first main electrode 12 and an opening ratio of the first sub-electrode 13 is preferably within 0.5%. Thereby, in a case where the conductive member 1 is used for a touch panel, a difference between a light transmittance in the first main electrode 12 and a light transmittance in the first sub-electrode 13 is not conspicuous, and it is possible to obtain an excellent visibility.

Here, the opening ratio of each of the first main electrode 12 and the first sub-electrode 13 indicates a ratio of a region not occupied by the fine metal wires in light transmitting region of each of the first main electrode 12 and the first sub-electrode 13. For example, the opening ratios of the first main electrode 12 and the first sub-electrode 13 can be calculated by dividing a difference between the total area of a defined region and an area occupied by a plurality of the fine metal wires, in the region defined in the light transmitting regions of the first main electrode 12 and the first sub-electrode 13, by the total area of the defined region and by representing with a percentage.

It is possible to make the difference between the opening ratio of the first main electrode 12 and the opening ratio of the first sub-electrode 13 within 0.5% by providing, in the first main electrode 12, a first dummy pattern DP1 (see FIG. 7) insulated from the first conductive mesh pattern MPa and constituted by fine metal wires, which will be described later.

Figure 6:
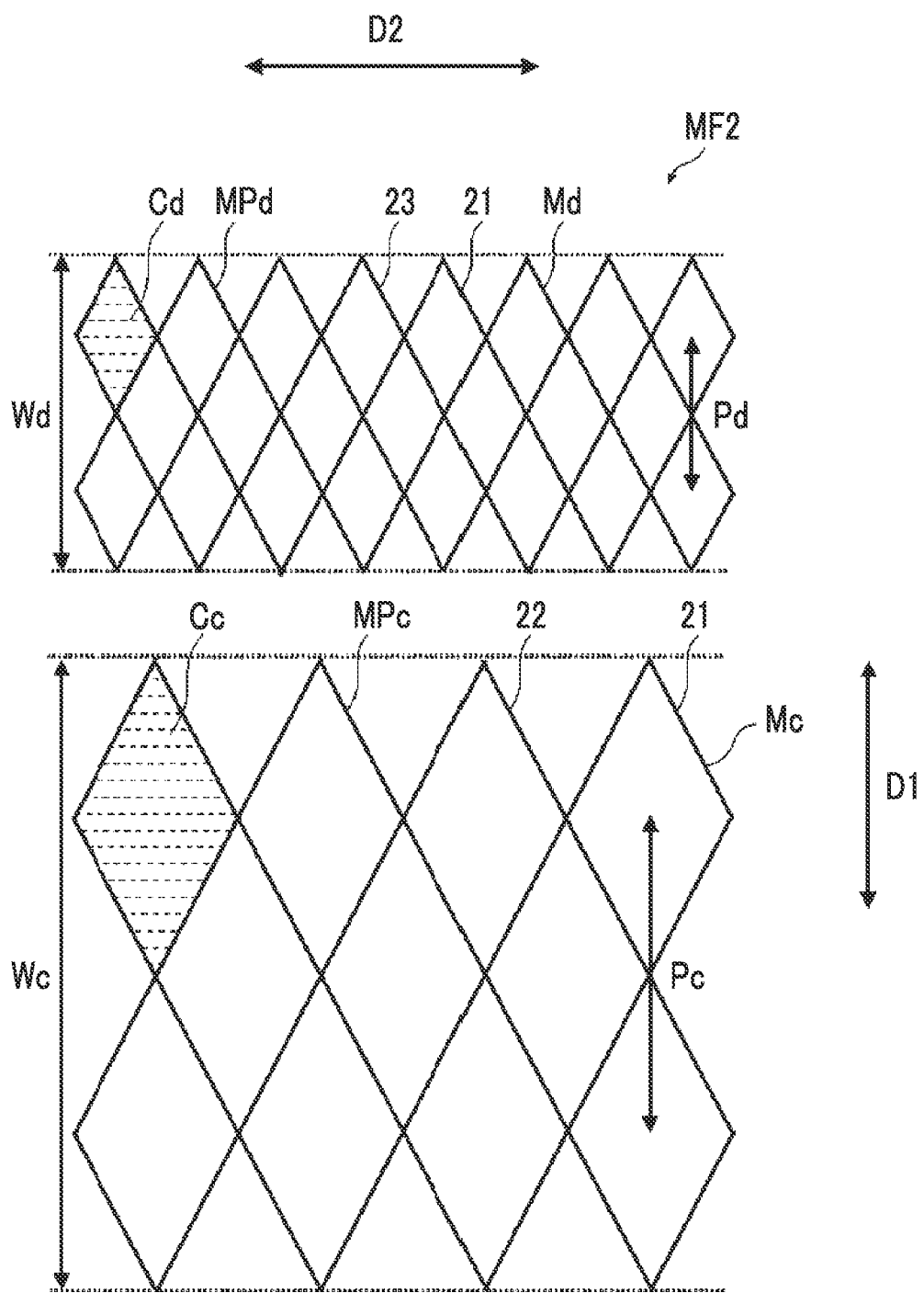
FIG. 6 is a partially enlarged plan view of a second main electrode and a second sub-electrode in Embodiment 1.

FIG. 6 shows a partially enlarged plan view of the second main electrode 22 and the second sub-electrode 23 of the second electrode 21 at the corner portion R of the conductive member 1. The plurality of second electrodes 21 are constituted by a second mesh conductive film MF2 having a third conductive mesh pattern MPc and a fourth conductive mesh pattern MPd. As shown in FIG. 6, the second main electrode 22 of the second electrode 21 is constituted by a third conductive mesh pattern MPc in which a plurality of fine metal wires Mc are electrically connected to one another. The third conductive mesh pattern MPc is constituted by a rhombus mesh, and has a plurality of rhombus mesh cells Cc. Further, a mesh pitch Pc of the third conductive mesh pattern MPc constituting the second main electrode 22 is determined by a distance in the first direction D1 between the centroids of the mesh cells Cc adjacent to each other in the first direction D1.

Further, the second sub-electrode 23 of the second electrode 21 is constituted by a fourth conductive mesh pattern MPd in which a plurality of fine metal wires Md are electrically connected to one another. The fourth conductive mesh pattern MPd is constituted by a rhombus mesh, and has a plurality of rhombus mesh cells Cd. Further, a mesh pitch Pd of the fourth conductive mesh pattern MPd constituting the second sub-electrode 23 is determined by a distance in the first direction D1 between the centroids of the mesh cells Cd adjacent to each other in the first direction D1.

As described above, since the plurality of second electrodes 21 are constituted by the second mesh conductive film MF2 constituted by the fine metal wires Mc and Md, it is possible to reduce a resistance value and a parasitic capacitance more than an electrode constituted by a transparent conductive oxide such as ITO. Therefore, in a case where the conductive member 1 including the plurality of second electrodes 21 is used for a touch panel, it is possible to obtain a touch panel with high detection sensitivity.

Similarly to the relationship between the mesh pitch Pa in the first main electrode 12 and the mesh pitch Pb in the first sub-electrode 13, over the entire region of the second sub-electrode 23, the mesh pitch Pd of the fourth conductive mesh pattern MPd constituting the second sub-electrode 23 is smaller than the mesh pitch Pc of the third conductive mesh pattern MPc constituting the second main electrode 22. Therefore, the number of intersections of the plurality of fine metal wires Md in the second sub-electrode 23 can be sufficiently ensured, and the number of the fine metal wires Md connecting a plurality of the intersections to one another can be sufficiently ensured. Thereby, in the second sub-electrode 23, the number of conductive paths can be sufficiently ensured, and thus even though a partial disconnection occurs in the plurality of fine metal wires Md constituting the second sub-electrode 23, an influence due to the disconnection can be reduced, and an increase in the resistance value of the second sub-electrode 23 can be suppressed.

In addition, the preferable value of the mesh pitch Pc is 500 μm or more and 2000 μm or less, and the preferable value of the mesh pitch Pd is 250 μm or more and 1000 μm or less. It is possible to obtain a touch panel with high-sensitivity by setting the mesh pitches Pc and Pd to a mesh pitch in the above range. In addition, the mesh pitch Pc is more preferably 700 μm or more, and still more preferably 800 μm or more. Furthermore, the mesh pitch Pc is more preferably less than 1600 μm, and still more preferably less than 1400 μm. In addition, the mesh pitch Pd is more preferably 350 μm or more, and still more preferably 400 μm or more. Furthermore, the mesh pitch Pd is more preferably less than 800 μm, and still more preferably less than 700 μm.

Further, a preferable range in a relationship between the mesh pitch Pc and the mesh pitch Pd is $1.2Pd \leq Pc \leq 5Pd$ from a viewpoint of detection sensitivity of the touch panel, a more preferable range is $1.5Pd \leq Pc \leq 4Pd$, and a particularly preferable range is $Pc=2Pd$.

Moreover, similarly to Expression (1) in the first electrode 11, it is desirable that the mesh pitch Pd of the fourth conductive mesh pattern MPd constituting the second sub-electrode 23 and the electrode width Wd of the second sub-electrode 23 satisfy the following Expression (4).

$$1.5Pd \leq Wd \qquad (4)$$

By satisfying Expression (4), it is possible to sufficiently ensure the number of conductive paths in the second sub-electrode 23 having the electrode width Wd, and in a case where the conductive member 1 is used for a touch panel, detection sensitivity and a uniformity of detection sensitivity of the touch panel can be improved.

Moreover, similarly to Expression (2) in the first electrode 11, it is desirable that the mesh pitch Pc of the third conductive mesh pattern MPc constituting the second main electrode 22 and the electrode width Wd of the second sub-electrode 23 satisfy the following Expression (5).

$$Wd < 1.5Pc \qquad (5)$$

By satisfying Expression (5), it is possible to sufficiently reduce the electrode width Wd of the second sub-electrode 23, and thus it is possible to reduce the parasitic capacitance in the second sub-electrode 23, and in a case where the conductive member 1 is used for a touch panel, detection sensitivity and a uniformity of detection sensitivity of the touch panel can be further improved.

Moreover, similarly to the expression (3) in the first electrode 11, it is desirable that the mesh pitch Pc of the third conductive mesh pattern MPc constituting the second main electrode 22 and the mesh pitch Pd of the fourth conductive mesh pattern MPd constituting the second sub-electrode 23 satisfy the following Expression (6).

$$Pc=2Pd \qquad (6)$$

By satisfying Expression (6), detection sensitivity of a touch panel can be improved in the second sub-electrode 23.

Further, a difference between an opening ratio of the second main electrode 22 and an opening ratio of the second sub-electrode 23 is preferably within 0.5%. Here, the opening ratio of the second main electrode 22 and the opening ratio of the second sub-electrode 23 can be obtained in the same manner as the opening ratio of the first main electrode 12 and the opening ratio of the first sub-electrode 13.

It is possible to make the difference between the opening ratio of the second main electrode 22 and the opening ratio of the second sub-electrode 23 within 0.5% by providing, in the second main electrode 22, a second dummy pattern DP2 (see FIG. 8) insulated from the third conductive mesh pattern MPc and constituted by fine metal wires, which will be described later.

By constituting the plurality of second electrodes 21 as described above, in a case where the conductive member 1 is used for a touch panel, it is possible to make detection sensitivity with respect to the touch operation uniform over the touch surface of the touch panel, and since existence of the plurality of second electrodes 21 is not conspicuous, it is possible to improve a visibility.

Further, the third conductive mesh pattern MPc constituting the second main electrode 22 may have the same mesh shape as a mesh shape of the first conductive mesh pattern MPa constituting the first main electrode 12. Further, the fourth conductive mesh pattern MPd constituting the second sub-electrode 23 may have the same mesh shape as a mesh shape of the second conductive mesh pattern MPb constituting the first sub-electrode 13. With such a configuration, in a case where the conductive member 1 is used for a touch panel, a difference between the plurality of first electrodes 11 and the plurality of second electrodes 21 is not conspicuous, and it is possible to obtain an excellent visibility. In particular, in a case where the mesh is a rhombus, the centroid of the rhombus mesh cell Ca constituting the first conductive mesh pattern MPa is arranged so as to be overlapped with an apex of the rhombus mesh cell Cc constituting the third conductive mesh pattern MPc, and thus the mesh pattern formed by overlapping the first mesh conductive film MF1 and the second mesh conductive film MF2 with each other has a uniform shape, and it is possible to obtain an excellent visibility.

Further, in Embodiment 1, the plurality of first electrodes 11 are formed on the front surface 2A of the transparent insulating substrate 2, and the plurality of second electrodes 21 are formed on the back surface 2B of the transparent insulating substrate 2, but the plurality of first electrodes 11 and the plurality of second electrodes 21 may not be formed on the transparent insulating substrate 2 as long as the electrodes are insulated from each other. For example, it is possible to employ a configuration in which two electrode substrates are bonded via a transparent pressure sensitive adhesive layer as illustrated in FIG. 11 of JP2016-126731A, or may be a configuration in which column wires and row wires are provided on a transparent substrate via an interlayer insulation film as illustrated in FIG. 4 of JP2010-097536A.

In Embodiment 1, the pair of first sub-electrodes 13 is arranged on the outermost side among the plurality of first electrodes 11 arranged in parallel in the second direction D2, but it is possible to set one of the first electrodes 11 arranged at both ends in the second direction D2 in the plurality of first electrodes 11 as the first sub-electrode 13 and to set the other as the first main electrode 12. In addition, the pair of second sub-electrodes 23 is arranged on the outermost side among the plurality of second electrodes 21 arranged in parallel in the first direction D1, but it is possible to set one of the second electrodes 21 arranged at both ends in the first direction D1 in the plurality of second electrodes 21 as the second sub-electrode 23 and to set the other as the second main electrode 22.

As described above, even though the plurality of first electrodes 11 include one first sub-electrode 13 and the plurality of second electrodes 21 include one second sub-electrode 23, in a case where the conductive member 1 is used for a touch panel, it is possible to improve a uniformity of detection sensitivity with respect to a touch operation.

In addition, it is possible to use any first electrode 11 among the plurality of first electrodes 11 as a first sub-electrode 13. For example, it is possible to arrange the plurality of first sub-electrodes 13 inside the pair of first electrodes 11 arranged on the outermost side among the plurality of first electrodes 11. Thereby, detection sensitivity with respect to a touch operation can be adjusted in an inner portion of the pair of first electrodes 11 arranged on the outermost side among the plurality of first electrodes 11.

In addition, similarly to the plurality of first electrodes 11, any second electrode 21 in the plurality of second electrodes 21 can be used as the second sub-electrode 23.

As described above, in a case where the plurality of first electrodes 11 include at least one first sub-electrode 13, the plurality of second electrodes 21 include at least one second sub-electrode 23, and the conductive member 1 is used for a touch panel, it is possible to adjust detection sensitivity with respect to a touch operation.

In addition, in Embodiment 1, the electrode width Wa of each of the plurality of first main electrodes 12 is smaller than the electrode width Wc of each of the plurality of second main electrodes 22, but it is possible to design the electrode width of each of the plurality of first main electrodes to be larger than the electrode width Wc of each of the plurality of second main electrodes 22 and it is possible to design the electrode width of each of the plurality of first main electrodes to have the same size as the electrode width Wc of each of the plurality of second main electrodes 22. In addition, in Embodiment 1, the electrode width Wb of each of a pair of first sub-electrodes 13 is smaller than the electrode width Wd of each of a pair of second sub-electrodes 23, but it is possible to design the electrode width of each of a pair of first sub-electrodes to be larger than the electrode width Wd of each of a pair of second sub-electrodes 23 and it is possible to design the electrode width of each of a pair of first sub-electrodes to have the same size as the electrode width Wd of each of a pair of second sub-electrodes 23.

In Embodiment 1, the first conductive mesh pattern MPa and the second conductive mesh pattern MPb constituting the plurality of first electrodes 11, and the third conductive mesh pattern MPc and the fourth conductive mesh pattern MPd constituting the plurality of second electrodes 21 are all constituted by a rhombus mesh, but the present invention is not limited to the rhombus mesh. That is, it is possible to form the plurality of mesh cells included in the plurality of first electrodes 11 and the plurality of second electrodes 21 as a regular hexagon, a regular triangle, a parallelogram, and other polygonal shapes other than the rhombus. These mesh cells are preferably formed as a rhombus mesh from a viewpoint of reducing moire with a display device, and an acute angle of the rhombus is preferably 20 degrees to 70 degrees.

In addition, the plurality of first electrodes 11 and the plurality of second electrodes 21 are constituted by a rhombus mesh having a fixed type of regular pattern, but the present invention is not limited to this, and thus may be constituted by a mesh having an irregular pattern. In this case, it is possible to make the plurality of mesh cells included in the plurality of first electrodes 11 and the plurality of second electrodes 21 as a mesh cell of a polygonal shape, particularly, a quadrilateral shape or a parallelogram shape having a length of a side of −10% to +10% with respect to an average value of lengths of sides of the respective mesh cells. Further, in this case, the mesh pitch in the plurality of first electrodes 11 can be determined as an average value of distances in the second direction D2 between the centroids of the mesh cells adjacent to each other in the second direction D2. Further, the mesh pitch in the plurality of second electrodes 21 can be determined as an average value of distances in the first direction D1 between the centroids of the mesh cells adjacent to each other in the first direction D1.

With such a configuration, in a case where the conductive member 1 is used for a touch panel, it is possible to achieve both suppression of moire between the conductive member 1 and a pixel pattern of a display device (not shown) and reduction of color noise.

In addition, in a case where the plurality of first electrodes 11 and the plurality of second electrodes 21 are constituted by a mesh having an irregular pattern, and in a case where an average value of lengths of sides of the plurality of mesh cells and a mesh pitch thereof are calculated, the average value of the lengths of sides and the mesh pitch with respect to the mesh cells arranged in a region having a predetermined area can be calculated. For example, it is preferable to calculate the average value of the lengths of sides and the mesh pitch with respect to the plurality of mesh cells arranged in a 10 mm×10 mm region.

In addition, in Embodiment 1, the plurality of first electrodes 11 are arranged at intervals therebetween in the second direction D2, but it is possible to arrange a first dummy electrode (not shown) between the first electrodes 11 adjacent to each other. The first dummy electrode is constituted by a pattern formed with a plurality of fine metal wires, and is arranged so as to be insulated from the first electrode 11 adjacent in the second direction D2. The first dummy electrode is an electrode that is insulated from the first electrode and is electrically floating, and does not function as a sensor for a touch operation. By arranging such first dummy electrodes between the plurality of first electrodes 11, respectively, in a case where the conductive member 1 is used for a touch panel, the gaps between the plurality of first electrodes 11 become inconspicuous and it is possible to improve a visibility. In addition, in order to improve insulation properties, it is possible to provide a disconnection portion having a length of 5 μm or more and 25 μm or less in the fine matal wire constituting the first dummy electrode. Further, a pattern shape of the fine metal wire of the dummy electrode arranged between the adjacent first electrodes 11 is the same as a pattern shape of the fine metal wire of the first electrode including the first dummy pattern DP1 (see FIG. 7) which will be described later, but is more preferable in that the gap between the first electrodes becomes inconspicuous.

Further, similarly to the first dummy electrodes respectively arranged between the plurality of first electrodes 11, the second dummy electrodes (not shown) can be respectively arranged between the plurality of second electrodes 21. Thereby, in a case where the conductive member 1 is used for a touch panel, the gaps between the plurality of second electrodes 21 become inconspicuous and it is possible to improve a visibility. A pattern shape of the fine metal wire of the second dummy electrode arranged between the adjacent second electrodes 21 is the same as a pattern shape of the fine metal wire of the second electrode including the second dummy pattern DP2 (see FIG. 8) which will be described later, but is more preferable in that the gap between the second electrodes becomes inconspicuous.

Further, in a case where the first dummy electrodes are respectively arranged between the plurality of first electrodes 11, similarly to a relationship between the opening ratio of the first main electrode 12 and the opening ratio of the first sub-electrode 13 according to Embodiment 1, it is desirable that a difference between the opening ratio of the first main electrode 12 and the opening ratio of the first dummy electrode, and a difference between the opening ratio of the first sub-electrode 13 and the opening ratio of the first dummy electrode are all within 0.5%. Thereby, in a case where the conductive member including the first dummy electrode is used for a touch panel, a difference between a light transmittance in the first main electrode 12, a light transmittance in the first sub-electrode 13, and a light transmittance in the first dummy electrode is not conspicuous, and it is possible to improve a visibility.

Similarly, in a case where the second dummy electrodes are respectively arranged between the plurality of second electrodes 21, it is desirable that a difference between the opening ratio of the second main electrode 22 and the opening ratio of the second dummy electrode, and a difference between the opening ratio of the second sub-electrode 23 and the opening ratio of the second dummy electrode are all within 0.5%.

Embodiment 2

Figure 7:
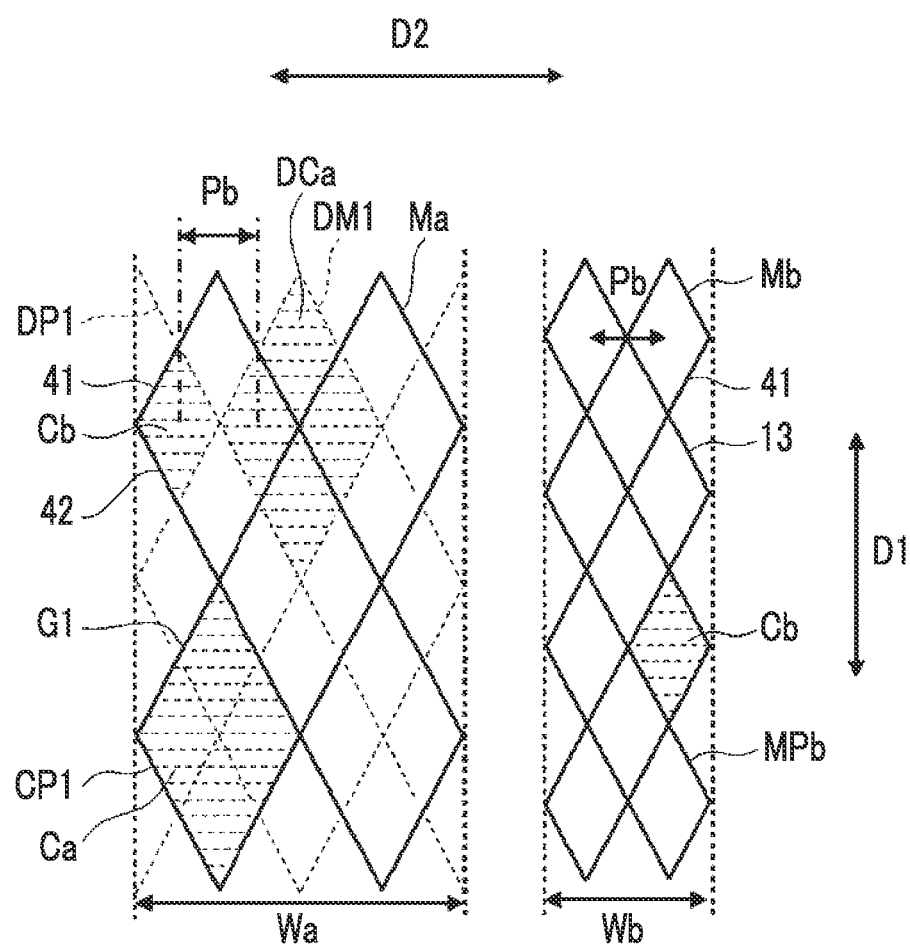
FIG. 7 is a partially enlarged plan view of a first main electrode and a first sub-electrode in Embodiment 2.

FIG. 7 is a partially enlarged plan view of a first main electrode 42 and a first sub-electrode 13 in Embodiment 2. The first sub-electrode 13 of a first electrode 41 in Embodiment 2 is the same as the first sub-electrode 13 in Embodiment 1, and the first main electrode 42 of the first electrode 41 in Embodiment 2 is the same as the first main electrode 12 in Embodiment 1 except that a first dummy pattern DP1 is included. The first dummy pattern DP1 is constituted by a plurality of fine metal wires DM1, and the plurality of fine metal wires DM1 are arranged with a gap G1 with respect to a plurality of fine metal wires Ma constituting the first conductive mesh pattern MPa. That is, the first dummy pattern DP1 is arranged so as to be electrically insulated from the first conductive mesh pattern MPa. In addition, the first dummy pattern DP1 is arranged on a line connecting the midpoints of sides of the mesh cell Ca facing each other so that the mesh cell Ca constituting the first conductive mesh pattern MPa is divided into four sections. That is, the first dummy pattern DP1 forms a pseudo mesh cell DCa that is the same as the mesh cell Ca constituting the first conductive mesh pattern MPa, and the pseudo mesh cell DCa is arranged at a position deviated from the first conductive mesh pattern MPa by a half of a repetition period of the mesh cell Ca in the second direction D2. Further, a distance of the gap G1 is preferably 5 μm or more and 25 μm or less. In addition, a disconnection portion (not shown) of 5 μm or more and 25 μm or less can be provided inside the first dummy pattern DP1.

Further, a composite mesh pattern CP1 having the same mesh pitch Pb as the mesh pitch Pb of the second conductive mesh pattern MPb of the first sub-electrode 13 is formed with the first conductive mesh pattern MPa and the first dummy pattern DP1. That is, the composite mesh pattern CP1 is constituted by a plurality of mesh cells Cb that are the same as the plurality of mesh cells Cb constituting the second conductive mesh pattern MPb of the first sub-electrode 13.

Therefore, in the first electrode 41 of Embodiment 2, it is possible to easily bring the opening ratio of the first main electrode 42 close to the opening ratio of the first sub-electrode 13 while keeping the mesh pitch Pb of the second conductive mesh pattern MPb constituting the first sub-electrode 13 smaller than the mesh pitch Pa of the first conductive mesh pattern MPa constituting the first main electrode 42. That is, by using the conductive member having the first main electrode 42 and the first sub-electrode 13 in Embodiment 2 for a touch panel, it is possible to improve a uniformity of detection sensitivity of the touch panel while improving a visibility of the touch panel, easily.

Here, a difference between the opening ratio of the first main electrode 42 including the first dummy pattern DP1 and the opening ratio of the first sub-electrode 13 is preferably within 0.5%, similarly to a difference between the opening ratio of the first main electrode 12 and the opening ratio of the first sub-electrode 13 Embodiment 1.

Figure 8:
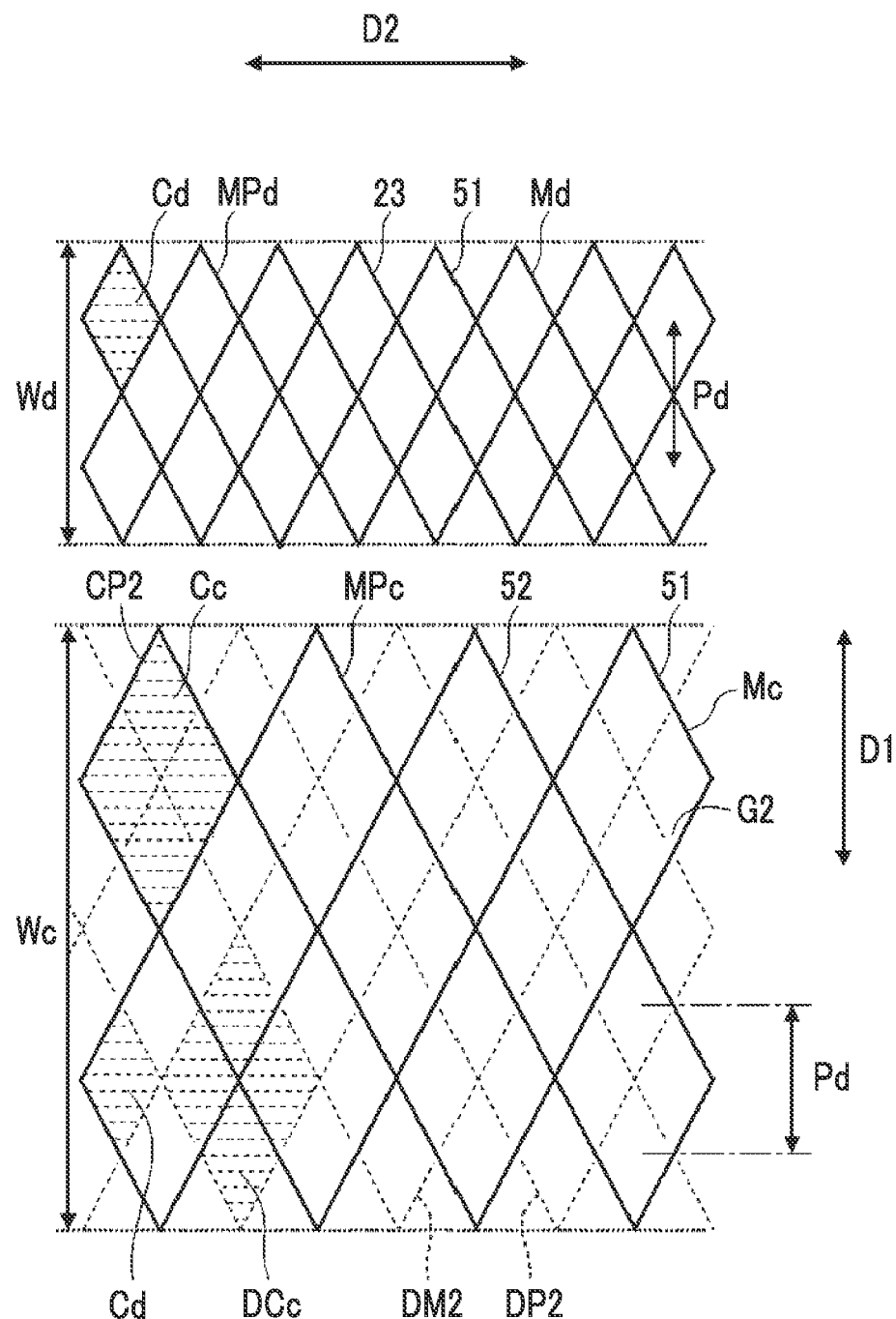
FIG. 8 is a partially enlarged plan view of a second main electrode and a second sub-electrode in Embodiment 2.

In addition, FIG. 8 is a partially enlarged plan view of a second main electrode 52 and a second sub-electrode 23 in Embodiment 2. It is possible to arrange the second dummy pattern DP2 also in the second main electrode 52 of the second electrode 51 in Embodiment 2, similarly to the first main electrode 42. The second dummy pattern DP2 is constituted by a plurality of fine metal wires DM2, and is arranged to be electrically insulated from the third conductive mesh pattern MPc constituting the second main electrode 52 with a gap G2. Further, the second dummy pattern DP2 in the second main electrode 52 forms a pseudo mesh cell DCc that is the same as the mesh cell Cc constituting the third conductive mesh pattern MPc, similarly to the first dummy pattern DP1 in the first main electrode 42. Further, a composite mesh pattern CP2 having the same mesh pitch Pd as the mesh pitch Pd of the fourth conductive mesh pattern MPd of the second sub-electrode 23 is formed with the third conductive mesh pattern MPc and the second dummy pattern DP2.

As described above, similarly to the first electrode 41, by using the conductive member having the second electrode 51 in Embodiment 2 for a touch panel, it is possible to improve a uniformity of detection sensitivity of the touch panel while improving a visibility of the touch panel, easily.

A distance of the gap G2 in the second main electrode 52 is preferably 5 μm or more and 25 μm or less, similarly to a distance of the gap G1 in the first main electrode 42. In addition, a disconnection portion (not shown) of 5 μm or more and 25 μm or less can be provided inside the second dummy pattern DP2. In addition, a difference between the opening ratio of the second main electrode including the second dummy pattern DP2 and the opening ratio of the second sub-electrode is preferably within 0.5%, similarly to a difference between the opening ratio of the first main electrode 42 and the opening ratio of the first sub-electrode 13.

Further, in Embodiment 2, the first dummy pattern DP1 included in the plurality of first main electrodes 42 and the second dummy pattern DP2 included in the plurality of second main electrodes 52 are constituted by a rhombus mesh, but, similarly to the plurality of first electrodes 11 and the plurality of second electrodes 21 in Embodiment 1, the present invention is not limited to the rhombus mesh. That is, it is possible to form the pseudo mesh cell included in the dummy patterns DP1 and DP2 as a regular hexagon, a regular triangle, a parallelogram, and other polygonal shapes other than the rhombus. The pseudo mesh cell is preferably formed as a rhombus mesh from a viewpoint of reducing moire with a display device, and an acute angle of the rhombus is preferably 20 degrees to 70 degrees.

In addition, the dummy patterns DP1 and DP2 are constituted by a pseudo rhombus mesh having a fixed type of regular pattern, but, similarly to the plurality of first electrodes 11 and the plurality of second electrodes 21 in Embodiment 1, the present invention is not limited to this, and thus may be constituted by a pseudo mesh having an irregular pattern. In this case, it is possible to make the plurality of pseudo mesh cells included in the dummy patterns DP1 and DP2 as a pseudo mesh cell of a polygonal shape, particularly, a quadrilateral shape or a parallelogram shape having a length of a side of −10% to +10% with respect to an average value of lengths of sides of the respective pseudo mesh cells. Further, in this case, the mesh pitch in the dummy patterns DP1 and DP2 can be determined as an average value of distances in the second direction D2 between the centroids of the pseudo mesh cells adjacent to each other in the second direction D2.

With such a configuration, in a case where the conductive member 1 is used for a touch panel, it is possible to achieve both suppression of moire between the conductive member 1 and a pixel pattern of a display device (not shown) and reduction of color noise.

In addition, in a case where the dummy patterns DP1 and DP2 are constituted by a pseudo mesh having an irregular pattern, and in a case where an average value of lengths of sides of the plurality of pseudo mesh cells and a mesh pitch thereof are calculated, similarly to a calculation method of the mesh pitch of the plurality of first electrodes 11 and the second electrodes 21 in Embodiment 1, the average value of the lengths of sides and the mesh pitch with respect to the pseudo mesh cells arranged in a region having a predetermined area can be calculated.

The pattern shapes of the dummy patterns DP1 and DP2 are not limited to the above, and for example, a combination with a dummy pattern disclosed in a patent specification filed as JP2017-042090 can be used. Further, the conductive mesh patterns MPa and MPc of the first main electrode 12 and the second main electrode 22 may be constituted by repeating mesh cells having the same shape, and the dummy patterns DP1 and DP2 may be constituted by irregular patterns.

For example, although not shown, the conductive mesh patterns MPa and MPc may be constituted by a rhombus mesh cell having the same shape, and the dummy patterns DP1 and DP2 may be constituted by a parallelogram pseudo mesh cell having a length of a side of −10% to +10%, preferably −5% to +5% with respect to the length of a side of the rhombus mesh cell of the conductive mesh patterns MPa and MPc. In addition, although not shown, the dummy patterns DP1 and DP2 may be constituted by a combination of patterns in which the fine metal wires of the dummy patterns DP1 and DP2 are irregularly parallel-translated by −10% to +10%, preferably −5% to +5% with respect to the length of a side of the rhombus mesh cell so as to be away from a line connecting the midpoints of the sides of the rhombus mesh cell facing each other.

Hereinafter, each member constituting the conductive member 1 will be described.

<Transparent Insulating Substrate>

The transparent insulating substrate 2 is not particularly limited, as long as the transparent insulating substrate is transparent, has electric insulation properties, and supports the first electrodes 11. As the material constituting the transparent insulating substrate 2, for example, glass, tempered glass, alkali free glass, polyethylene terephthalate (PET), polyethylene naphthalate (PEN), a cyclo-olefin polymer (COP), a cyclic olefin copolymer (COC), polycarbonate (PC), an acrylic resin, polyethylene (PE), polypropylene (PP), polystyrene (PS), polyvinyl chloride (PVC), polyvinylidene chloride (PVDC), cellulose triacetate (TAC), or the like can be used. The thickness of the transparent insulating substrate 2 is, for example, 20 to 1000 μm, and particularly preferably 30 to 100 μm. The light transmittance of the transparent insulating substrate 2 is preferably 40% to 100%. The light transmittance is measured by using "plastic—a method of obtaining total light transmittance and total light reflectance" regulated in JIS K 7375:2008.

<Fine Metal Wire>

The fine metal wire constituting the first conductive mesh pattern MPa, the second conductive mesh pattern MPb, the third conductive mesh pattern MPc, the fourth conductive mesh pattern MPd, the first dummy pattern DP1, the second dummy pattern DP2, and the first dummy electrode and the second dummy electrode (not shown) is a fine metal wire having a line width of 0.5 μm to 10 μm. The line width is more preferably 1 μm to 5 μm. A material for the fine metal wire is preferably silver, copper, aluminum, gold, molybdenum, chromium, or the like, and can be used in alloys, oxides, or laminates thereof. In particular, silver or copper is preferable from a viewpoint of the resistance value, for example, a fine metal wire having a laminated structure of molybdenum/aluminum/molybdenum, molybdenum/copper/molybdenum, copper oxide/copper/copper oxide, or the like can be used.

A film thickness of the fine metal wire is 0.05 μm to 10 μm, preferably 0.1 μm to 1 μm. In order to improve a visibility of the fine metal wire, a blackening layer may be provided on the fine metal wire or between the fine metal wire, the transparent insulating substrate, and the fine metal wire. As the blackening layer, copper oxide, molybdenum oxide, or the like can be used.

The following layers can be additionally provided on the conductive member 1 as required.

<Protective Layer>

A transparent protective layer may be provided on the fine metal wire for the purpose of protecting the fine metal wire. As the transparent protective layer, an organic film of gelatin, an acrylic resin, a urethane resin, or the like, and an inorganic film of silicon dioxide or the like can be used, and the film thickness is preferably 10 nm or more and 100 nm or less.

In addition, as necessary, a transparent coating layer may be formed on the protective layer. As the transparent coating layer, an organic film of an acrylic resin, a urethane resin, or the like is used, and the film thickness thereof is preferably 1 μm or more and 100 μm or less.

<Edge Part Wire Insulating Film>

For the purpose of preventing a short circuit between the edge part wires and corrosion of the edge part wire, an edge part wire insulating film may be formed on the first edge part wire 15 and the second edge part wire 25 as illustrated in FIG. 2. As the edge part wire insulating film, an organic film of an acrylic resin, a urethane resin, or the like is used, and the film thickness is preferably 1 μm or more and 30 μm or less. The edge part wire insulating film may be formed only on any one of the first edge part wires 15 and the second edge part wires 25.

EXAMPLES

Hereinafter, the present invention will be described in more detail based on the examples. The materials, amounts used, proportions, treatment details, treatment procedures, or the like described in the following examples can be appropriately changed without departing from the gist of the present invention, and the scope of the present invention is not construed by the following examples restrictively.

<Manufacturing of Touch Panel>

Various photo masks with different exposure patterns were prepared, and a plurality of first electrodes and a plurality of second electrodes constituted by a fine metal wire were respectively formed on both surfaces of the transparent insulating substrate, so as to manufacture a conductive member. Further, as the transparent insulating substrate of the conductive member, a polyethylene terephthalate film having a thickness of 38 μm was used, and a fine metal wire was formed of a silver wire. In addition, in the plurality of first electrodes and the plurality of second electrodes, the line width of the mesh, that is, the line width of each of the plurality of fine metal wires, was set to 4.0 μm, and a rhombus mesh shape with an acute angle of 60 degrees was adopted as the mesh shape.

Further, the manufactured conductive member was bonded to a cover panel made of tempered glass having a thickness of 1.1 mm, by using an optical transparent pressures sensitive adhesive sheet having a thickness of 75 μm and made of 8146-4 (model number) manufactured by 3M Company, so as to manufacture a touch panel. In order to drive the manufactured touch panel, an integrated circuit made by Atmel Corporation was connected to the touch panel.

<Evaluation of Uniformity of Touch Detection Sensitivity>

A distal end portion of a touch pen in which an outer diameter of the distal end portion was 1.0 mm was brought in contact with the manufactured touch panel, so as to perform evaluation of a uniformity of detection sensitivity of the touch panel. At this point, based on the position detection accuracy with respect to the contact position between the center portion and an outer peripheral portion of the touch panel and the distal end portion of the touch pen, evaluation standards of A to D were determined as follows. In a case where the evaluation was A or B, it was determined that position detection accuracy is not problematic in practical use.

In addition, the center portion of the touch panel was set to a region at an inner side of 4 mm from an edge of a detection region of the touch panel in the detection region of the touch panel, and the outer peripheral portion of the touch panel was set as a portion other than the center portion of the touch panel from an entire detection region of the touch panel.

A: a very excellent level; the position detection accuracy is less than 1.0 mm in both the center portion and the outer peripheral portion of the touch panel, and high accuracy position detection can be performed in the entire detection region of the touch panel.

B: an excellent level without a problem in practical use; position detection accuracy of the center portion of the touch panel is less than 1.0 mm, position detection accuracy of a part of the outer peripheral portion of the touch panel is 1.0 mm or more and less than 2.0 mm, and high accuracy position detection can be performed over the entire detection region of the touch panel.

C: a level with a problem in practical use; position detection accuracy of the center portion of the touch panel is less than 1.0 mm, detection accuracy of a part of the outer peripheral portion of the touch panel is 2.0 mm or more, and there is a problem in position detection accuracy of the outer peripheral portion of the touch panel.

D: a level with a serious problem in practical use; there is a portion where position detection cannot be performed on the outer peripheral portion of the touch panel.

<Visibility Evaluation>

The manufactured touch panel was observed with bare eyes of 10 observers at a position spaced by 5 cm from the front surface of the touch panel, so as to evaluate whether a pattern shape of the electrode and a fine metal wire were recognized. With respect to the visibility, the evaluation standards of A to C were obtained as follows, the most frequent evaluation result among the evaluation results of 10 observers was set as a final evaluation result with respect to the touch panel.

A: the pattern shape of the electrode and the fine metal wire are not visually recognized at all.

B: the pattern shape of the electrode is not visually recognized, but the fine metal wire is visually recognized.

C: the pattern shape of the electrode and the fine metal wire are visually recognized.

Here, a method of manufacturing the conductive member will be described specifically.

(Preparation of Silver Halide Emulsion)

The following solutions 2 and 3 were added by an amount corresponding to each 90% thereof to the following solution 1 kept at a temperature of 38° C. and pH (potential of hydrogen) of 4.5 with stirring over 20 minutes, so as to form nuclear particles of 0.16 μm. Subsequently, the following solutions 4 and 5 were added over 8 minutes, and the following solutions 2 and 3 were added by a remaining amount of each 10% thereof over 2 minutes, so as to grow particles to 0.21 μm. Further, 0.15 g of potassium iodide was added and aged for 5 minutes so as to complete particle formation.

Solution 1:
  Water . . . 750 ml
  Gelatin . . . 9 g
  Sodium chloride . . . 3 g
  1,3-Dimethylimidazolidine-2-thione . . . 20 mg
  Sodium benzenethiosulfonate . . . 10 mg
  Citric acid . . . 0.7 g
Solution 2:
  Water . . . 300 ml
  Silver nitrate . . . 150 g
Solution 3:
  Water . . . 300 ml
  Sodium chloride . . . 38 g
  Potassium bromide . . . 32 g
  Potassium hexachloroiridate(III) (0.005% KCl 20% aqueous solution) . . . 8 ml
  Ammonium hexachlororhodate (0.001% NaCl 20% aqueous solution) . . . 10 ml
Solution 4:
  Water . . . 100 ml
  Silver nitrate . . . 50 g
Solution 5:
  Water . . . 100 ml
  Sodium chloride . . . 13 g
  Potassium bromide . . . 11 g
  Yellow prussiate of potash . . . 5 mg Thereafter, washing with water was performed by a flocculation method according to a general method. Specifically, the temperature was decreased to 35° C., 3 liters of distilled water was added, and sulfuric acid was used to lower the pH until the silver halide was precipitated (in the range of pH 3.6±0.2). Next, about 3 liters of supernatant was removed (first washing with water). Additional 3 liters of distilled water was added, and sulfuric acid was added, until the silver halide was precipitated. Again, 3 liters of supernatant was removed (second washing with water). The same operation as the second washing with water was further repeated one more time (third washing with water) to complete a water washing-desalting step. An emulsion after washing and desalting was adjusted to pH 6.4 and pAg 7.5, 3.9 g of gelatin, 10 mg of sodium benzenethiosulfonate, 3 mg of sodium benzenethiosulfinate, 15 mg of sodium thiosulfate, and 10 mg of chloroauric acid were added, chemical sensitization was performed so as to obtain the optimum sensitivity at 55° C., and 100 mg of 1,3,3a,7-tetrazaindene as a stabilizer and 100 mg of PROXEL (trade name, manufactured by ICI Co., Ltd.) as a preservative were added. The finally obtained emulsion was a silver iodochlorobromide cubic grain emulsion including 0.08 mol % of silver iodide, having a proportion of silver chlorobromide of 70 mol % of silver chloride and 30 mol % of silver bromide, and having an average particle diameter of 0.22 μm and a coefficient of variation of 9%.

(Preparation of Composition for Forming Photosensitive Layer)

$1.2 \times 10^1$ mol/mol Ag of 1,3,3a,7-tetrazaindene, $1.2 \times 10^2$ mol/mol Ag of hydroquinone, $3.0 \times 10^{-4}$ mol/mol Ag of citric acid, 0.90 g/mol Ag of 2,4-dichloro-6-hydroxy-1,3,5-triazine sodium salt, and a slight amount of a hardener were added to the above emulsion, and pH of the coating solution was adjusted to 5.6 by using citric acid.

A polymer latex containing a polymer represented by (P-1) and a dispersing agent consisting of dialkylphenyl PEO sulfate ester (a mass ratio of dispersing agent/polymer is 2.0/100=0.02) was added to the above coating solution such that polymer/gelatin (mass ratio)=0.5/1 is satisfied with respect the containing gelatin.

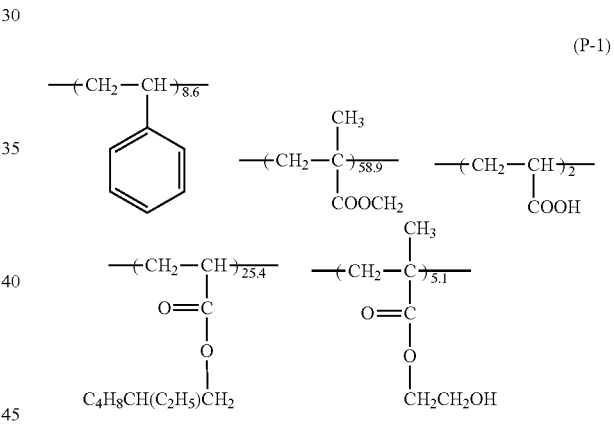

(P-1)

EPOXY RESIN DY 022 (trade name: manufactured by Nagase ChemteX Corp.) was added as a crosslinking agent. The addition amount of the crosslinking agent was adjusted such that the amount of the crosslinking agent in the photosensitive layer described below is 0.09 g/m².

The composition for forming a photosensitive layer was prepared as above.

The polymer represented by (P-1) described above was synthesized with reference to JP3305459B and JP3754745B.

(Photosensitive Layer Formation Step)

Both surfaces of the transparent insulating substrate were coated with the above polymer latex, so as to provide an undercoat layer having a thickness of 0.05 μm. As the transparent insulating substrate, polyethylene terephthalate film of 38 μm (manufactured by Fujifilm Corporation) was used.

Next, an antihalation layer consisting of a mixture of the above polymer latex, gelatin, and a dye having an optical density of about 1.0 and being decolorized by alkali of a developer was provided on the undercoat layer. The mixing mass ratio (polymer/gelatin) of the polymer and the gelatin was 2/1, and the content of the polymer was 0.65 g/m².

The antihalation layer was coated with the composition for forming a photosensitive layer and was further coated with a composition obtained by mixing the polymer latex, gelatin, EPOCROSS K-2020E (trade name: manufactured by Nippon Shokubai Co., Ltd., oxazoline-based crosslinking reactive polymer latex (crosslinkable group: oxazoline group)), and SNOWTEX C (registered trademark, trade name: manufactured by Nissan Chemical Industries, Ltd., colloidal silica) at a solid content mass ratio (polymer/gelatin/EPOCROSS K-2020E/SNOWTEX C (registered trademark)) of 1/1/0.3/2 such that the amount of gelatin is 0.08 g/m², so as to obtain a support on both surfaces of which photosensitive layers were formed. A support on both surfaces of which photosensitive layers were formed is referred to as a film A. The formed photosensitive layer had a silver content of 6.2 g/m² and a gelatin content of 1.0 g/m².

(Exposure and Development Step)

For example, a first photo mask for forming a first electrode having a pattern as illustrated in FIG. 4 and a second photo mask for forming a second electrode having a pattern as illustrated in FIG. 6 were respectively prepared, the first photo mask and the second photo mask were arranged on both surfaces of the above described film A, and the both surfaces were simultaneously exposed with parallel light by using a high pressure mercury lamp as a light source.

After the exposure, development treatment was performed by using the following developer, and development treatment was further performed by using a fixing solution (trade name: N3X-R for CN16X, manufactured by Fujifilm Corporation). Rinsing with pure water was performed, and the water was dried, so as to obtain a support on both surfaces of which fine metal wires made of Ag (silver) and gelatin layers were formed. The gelatin layer was formed between the fine metal wires. The obtained film was referred to as a film B.

(Composition of Developer)

The following compounds were contained in 1 liter (L) of a developer.

Hydroquinone . . . 0.037 mol/L
N-methylaminophenol . . . 0.016 mol/L
Sodium metaborate . . . 0.140 mol/L
Sodium hydroxide . . . 0.360 mol/L
Sodium bromide . . . 0.031 mol/L
Potassium metabisulfite . . . 0.187 mol/L (Gelatin Degradation Treatment)

The film B was immersed in an aqueous solution (concentration of proteolytic enzyme: 0.5 mass %, solution temperature: 40° C.) of a proteolytic enzyme (BIOPLASE AL-15FG manufactured by Nagase ChemteX Corporation) for 120 seconds. The film B was extracted from the aqueous solution, immersed in warm water (solution temperature: 50° C.) for 120 seconds, and washed. The film after gelatin degradation treatment is referred to as a film C.

<Resistance Reduction Treatment>

A calender treatment was performed on the above described film C by using a calender device including metal rollers at a pressure of 30 kN. At this point, two polyethylene terephthalate films having a rough surface shape of line asperity Ra=0.2 μm, Sm=1.9 μm (measured with a shape analysis laser microscope VK-X110 manufactured by Kevence Corporation (JIS-B-0601-1994)) were transported such that the rough surfaces face the front and back surfaces of the above described film C, and the rough shapes were transferred and formed on the front and back surfaces of the above described film C.

After the above described calender treatment, this film was passed through an overheated steam tank at a temperature of 150° C. for 120 seconds to perform heat treatment. The film after the heat treatment is referred to as a film D. This film D is a conductive member.

Next, Examples 1 to 4 and Comparative Examples 1 and 2 are described.

Example 1

Example 1 is a touch panel having a conductive member of the same shape as that of the conductive member 1 of Embodiment 1 illustrated in FIGS. 1 to 4 and 6. The line width of each of the plurality of fine metal wires Ma and Mb constituting the plurality of first electrodes 11 and the plurality of second electrodes 21 is set to 4.0 μm, and the first conductive mesh pattern MPa and the second conductive mesh pattern MPb constituting the plurality of first electrodes 11, and the third conductive mesh pattern MPc and the fourth conductive mesh pattern MPd constituting the plurality of second electrodes 21 were a rhombus mesh with an acute angle of 60 degrees. In addition, in the first electrode 11, the mesh pitch Pa of the first conductive mesh pattern MPa constituting the first main electrode 12 was set to 800 μm, the electrode width Wa of the first main electrode 12 was set to 2.00 mm, the mesh pitch Pb of the second conductive mesh pattern MPb constituting the first sub-electrode 13 was set to 400 μm, and the electrode width Wb of the first sub-electrode 13 was set to 1.10 mm. At this point, Wb/Pa=1.38 and Wb/Pb=2.75, and the difference between the opening ratio of the first main electrode 12 and the opening ratio of the first sub-electrode 13 was 1.0%. In addition, in the second electrode 21, the mesh pitch Pc of the third conductive mesh pattern MPc constituting the second main electrode 22 was set to 1385.6 μm, the electrode width Wc of the second main electrode 22 was set to 4.00 mm, the mesh pitch Pd of the fourth conductive mesh pattern MPd constituting the second sub-electrode 23 was set to 1385.6 μm, and the electrode width Wd of the second sub-electrode 23 was set to 2.20 mm. At this point, Wd/Pc=1.59 and Wd/Pd=1.59, and the difference between the opening ratio of the second main electrode 22 and the opening ratio of the second sub-electrode 23 was 0.0%. Further, the first conductive mesh pattern MPa and the third conductive mesh pattern MPc were overlapped with each other so that the centroid of the rhombus mesh cell Ca of the first conductive mesh pattern MPa is overlapped with an apex of the rhombus mesh cell Cc of the third conductive mesh pattern MPc.

Example 2

Example 2 is the same as Example 1 except that the plurality of first main electrodes include a dummy pattern having the same shape as the first dummy pattern DP1 in Embodiment 2. As shown in FIG. 7, the first dummy pattern DP1 has the same mesh pitch Pa as that of the first conductive mesh pattern MPa constituting the first main electrode 12 in Example 1, and is arranged at a position deviated from the first conductive mesh pattern MPa in the second direction D2 by half of the mesh pitch Pa. At this point, the difference between the opening ratio of the first main electrode 42 of Example 2 including the first dummy pattern DP1 and the opening ratio of the first sub-electrode 13 was 0.1%.

Example 3

Example 3 is the same as Example 1 except that the mesh pitch Pd of the fourth conductive mesh pattern MPd constituting the second sub-electrode 23 was 692.8 μm. At this point, Wd/Pc=1.59 and Wd/Pd=3.18, and the difference between the opening ratio of the second main electrode 22 and the opening ratio of the second sub-electrode 23 was 1.0%.

Example 4

Example 4 is the same as Example 3 except that the plurality of first main electrodes 42 and the plurality of second main electrodes 52 include a dummy pattern having the same shape as the dummy patterns DP1 and DP2 in Embodiment 2. As shown in FIG. 7, the dummy pattern included in the first main electrode 42 in Example 4 has the same mesh pitch Pa as that of the first conductive mesh pattern MPa constituting the first main electrode 12 in Example 3, and is arranged at a position deviated from the first conductive mesh pattern MPa in the second direction D2 by half of the mesh pitch Pa. In addition, as shown in FIG. 7, the dummy pattern included in the second main electrode in Example 4 has the same mesh pitch Pc as that of the third conductive mesh pattern MPc constituting the second main electrode 22 in Example 3, and is arranged at a position deviated from the third conductive mesh pattern MPc in the first direction D1 by half of the mesh pitch Pc. At this point, the difference between the opening ratio of the first main electrode 42 and the opening ratio of the first sub-electrode 13 in Example 4 including the dummy pattern was 0.1%, and the difference between the opening ratio of the second main electrode and the opening ratio of the second sub-electrode in Example 4 including the dummy pattern was 0.1%.

Comparative Example 1

Comparative Example 1 is the same as Example 1 except that the mesh pitch Pb of the second conductive mesh pattern MPb constituting the first sub-electrode 13 was 800 μm. At this point, Wb/Pa=1.38 and Wb/Pb=1.38, and the difference between the opening ratio of the first main electrode 12 and the opening ratio of the first sub-electrode 13 was 0.0%.

Comparative Example 2

Comparative Example 2 is the same as Example 1 except that the mesh pitch Pa of the first conductive mesh pattern MPa constituting the first main electrode 12 was set to 400 μm, and the mesh pitch Pb of the second conductive mesh pattern MPb constituting the first sub-electrode 13 was 800 μm. At this point, Wb/Pa=2.75 and Wb/Pb=1.38, and the difference between the opening ratio of the first main electrode 12 and the opening ratio of the first sub-electrode 13 was 1.0%.

The evaluation results of Examples 1 to 4 and Comparative Examples 1 and 2 are presented in the following table.

TABLE 11

| | First electrode | | | | | | | | Second electrode | |
|---|---|---|---|---|---|---|---|---|---|---|
| | Pa (μm) | Pb (μm) | Wa (mm) | Wb (mm) | Wb/Pa | Wb/Pb | Dummy pattern | Opening ratio difference | Pc (μm) | Pd (μm) |
| Example 1 | 800 | 400 | 2.00 | 1.10 | 1.38 | 2.75 | Absence | 1.0% | 1385.6 | 1385.6 |
| Example 2 | 800 | 400 | 2.00 | 1.10 | 1.38 | 2.75 | Presence | 0.1% | 1385.6 | 1385.6 |
| Comparative Example 1 | 800 | 800 | 2.00 | 1.10 | 1.38 | 1.38 | Absence | 0.0% | 1385.6 | 1385.6 |
| Comparative Example 2 | 400 | 800 | 2.00 | 1.10 | 2.75 | 1.38 | Absence | 1.0% | 1385.6 | 1385.6 |
| Example 3 | 800 | 400 | 2.00 | 1.10 | 1.38 | 2.75 | Absence | 1.0% | 1385.6 | 692.8 |
| Example 4 | 800 | 400 | 2.00 | 1.10 | 1.38 | 2.75 | Presence | 0.1% | 1385.6 | 692.8 |

| | Second electrode | | | | | | Evaluation result | |
|---|---|---|---|---|---|---|---|---|
| | Wc (mm) | Wd (mm) | Wd/Pc | Wd/Pd | Dummy pattern | Opening ratio difference | Uniformity of detection sensitivity | Visibility |
| Example 1 | 4.00 | 2.20 | 1.59 | 1.59 | Absence | 0.0% | B | C |
| Example 2 | 4.00 | 2.20 | 1.59 | 1.59 | Absence | 0.0% | B | B |
| Comparative Example 1 | 4.00 | 2.20 | 1.59 | 1.59 | Absence | 0.0% | D | B |
| Comparative Example 2 | 4.00 | 2.20 | 1.59 | 1.59 | Absence | 0.0% | D | C |
| Example 3 | 4.00 | 2.20 | 1.59 | 3.18 | Absence | 1.0% | A | C |
| Example 4 | 4.00 | 2.20 | 1.59 | 3.18 | Presence | 0.1% | A | A |

As shown in Table 1, in Example 2 and Example 4, evaluation of a uniformity of touch detection sensitivity and evaluation of a visibility were both "B" or higher, and the visibility could be improved while improving the uniformity of touch detection sensitivity. Particularly, in Example 4, evaluation of a uniformity of touch detection sensitivity and evaluation of a visibility were both "A", and the uniformity of touch detection sensitivity was excellent and the visibility could be improved.

On the other hand, in Example 3, evaluation of a uniformity of touch detection sensitivity was "A", but evaluation of a visibility was "C". In addition, in Example 1, evaluation of a uniformity of touch detection sensitivity was "B", but evaluation of a visibility was "C". In Comparative Example 1, evaluation of a visibility was "B", but evaluation of a uniformity of touch detection sensitivity was "D". In Comparative Example 2, evaluation of a uniformity of touch detection sensitivity was "D", but evaluation of a visibility was "C".

In Example 4 in which the evaluation of uniformity of detection sensitivity and the evaluation of a visibility were both "A", the mesh pitch Pb of the second conductive mesh pattern MPb constituting the first sub-electrode 13 is smaller than the mesh pitch Pa of the first conductive mesh pattern MPa constituting the first main electrode 42 and the electrode width Wb of the first sub-electrode 13 satisfies Expressions (1) and (2). Therefore, it is considered that in the first sub-electrode 13, the number of conductive paths is sufficiently ensured, and the influence of disconnection is small. Further, it is considered that since the mesh pitch Pd of the fourth conductive mesh pattern MPd constituting the second sub-electrode in Example 4 is smaller than the mesh pitch of the third conductive mesh pattern MPc constituting the second main electrode, in the second sub-electrode, the number of conductive paths is sufficiently ensured, and the influence of disconnection is small. Therefore, it is considered that in the touch panel obtained by using the conductive member of Example 4, a uniformity of detection sensitivity is improved, and evaluation of a sensitivity uniformity was "A".

In addition, the first main electrode 42 and the second main electrode each include a dummy pattern, and the difference between the opening ratio of the first main electrode 42 and the opening ratio of the first sub-electrode 13 and the difference between the opening ratio of the second main electrode and the opening ratio of the second sub-electrode are both 0.1%. Therefore, it is considered that in the touch panel obtained by using the conductive member of Example 4, the difference between the light transmittance in the first main electrode 42 and the light transmittance in the first sub-electrode 13 is not conspicuous, and evaluation of a visibility was "A".

Example 3 is the same as Example 4 except that the first main electrode 12 and the second main electrode 22 do not include a dummy pattern. Therefore, it is considered that in Example 3, the difference in light transmittance between the first main electrode 12 and the first sub-electrode 13 which have different mesh pitches is conspicuous and the difference in light transmittance between the second main electrode 22 and the second sub-electrode 23 which have different mesh pitches is conspicuous, and evaluation of a visibility was "C".

However, evaluation of a uniformity of detection sensitivity is "A" for the same reason as in Example 4, and thus in a case where the conductive member 1 of Example 3 is used for a touch panel, it is possible to obtain an excellent touch panel that is not problematic in practical use.

Example 2 is the same as Example 4 except that the mesh pitch Pd in the second sub-electrode 23 is 1385.6 µm which is the same as the mesh pitch Pc in the second main electrode 22, and the second main electrode 22 does not include a dummy pattern. Therefore, it is considered that in Example 2, since the number of conductive paths is sufficiently ensured in the first sub-electrode 13, while the number of conductive paths is not sufficiently ensured in the second sub-electrode 23, evaluation of a uniformity of detection sensitivity was "B".

In addition, in Example 2, since the first main electrode 42 includes the first dummy pattern DP1, the composite mesh pattern having half of the mesh pitch Pa of the first conductive mesh pattern MPa constituting the first main electrode 42, that is, a mesh pitch Pb of 400 µm in the second direction D2 is formed in the first main electrode 42. On the other hand, the mesh pitch Pc in the second main electrode 22 in the first direction D1 and the mesh pitch Pd in the second sub-electrode 23 in the first direction D1 are both 1385.6 µm. Therefore, it is considered that the mesh shape of the second electrode 21 is coarser than the mesh shape of the first electrode 11, and thus, in the touch panel obtained by using the conductive member of Example 2, the plurality of fine metal wires constituting the second electrode 21 are easily conspicuous, and evaluation of a visibility was "B".

However, as described above, evaluation of a uniformity of detection sensitivity and evaluation of a visibility in Example 2 are both "B", and thus in a case where the conductive member of Example 2 is used for a touch panel, it is possible to obtain a touch panel that is not problematic in practical use.

Example 1 is the same as Example 4 except that the mesh pitch Pd in the second sub-electrode 23 is 1385.6 µm which is the same as the mesh pitch Pc in the second main electrode 22, and the first main electrode 12 and the second main electrode 22 do not include a dummy pattern. Therefore, it is considered that in Example 1, similarly to Example 2, since the number of conductive paths is not sufficiently ensured in the second sub-electrode 23, evaluation of a uniformity of detection sensitivity was "B".

Moreover, it is considered that in Example 1, since the first main electrode 12 does not include a dummy pattern, the difference in the light transmittance in the first main electrode 12 and the light transmittance in the first sub-electrode 13 is conspicuous, and thus evaluation of a visibility was "C".

However, as described above, in Example 1, evaluation of a uniformity of detection sensitivity is "B" and evaluation of a visibility is "C", and thus in a case where the conductive member 1 of Example 1 is used for a touch panel, it is possible to obtain a touch panel that is not problematic in practical use.

In Comparative Example 1, the mesh pitch Pb in the first sub-electrode 13 is set to 800 µm, which is the same as the mesh pitch Pa in the first main electrode 12, and the mesh pitch Pd in the second sub-electrode 23 is set to 1385.6 µm, which is the same as the mesh pitch Pc in the second main electrode 22. Therefore, it is considered that in Comparative Example 1, the number of conductive paths in the first sub-electrode 13 and the second sub-electrode 23 is not sufficiently ensured, and the influence of the disconnection in the first sub-electrode 13 and the second sub-electrode 23 is large, and thus, evaluation of a uniformity of detection sensitivity was "D".

In addition, in Comparative Example 1, the first main electrode 12 and the second main electrode 22 do not include a dummy pattern, but the mesh pitch Pa in the first main electrode 12 and the mesh pitch Pb in the first sub-electrode 13 are the same as each other, and the mesh pitch Pc in the second main electrode 22 and the mesh pitch Pd in the second sub-electrode 23 are the same as each other, and thus evaluation of a visibility is "B", but evaluation of a uniformity of detection sensitivity is "D". Therefore, in a case where the conductive member 1 of Comparative Example 1 is used for a touch panel, this touch panel is problematic in practical use.

In Comparative Example 2, the mesh pitch Pb in the first sub-electrode 13 is set to 800 µm, which is larger than the mesh pitch Pa of 400 µm in the first main electrode 12, and the mesh pitch Pd in the second sub-electrode 23 is set to 1385.6 µm, which is the same as the mesh pitch Pc in the second main electrode 22. Therefore, it is considered that in Comparative Example 2, the number of conductive paths in the first sub-electrode 13 and the second sub-electrode 23 is not sufficiently ensured, and the influence of the disconnection in the first sub-electrode 13 and the second sub-electrode 23 is large, and thus, evaluation of a uniformity of detection sensitivity was "D".

In addition, it is considered that the difference between the opening ratio of the first main electrode 12 and the opening ratio of the first sub-electrode 13 is 1.0%, and the difference between the light transmittance of the first main electrode 12 and the light transmittance of the first sub-electrode 13 is conspicuous, and thus evaluation of a visibility was "C".

Accordingly, in Comparative Example 2, evaluation of a uniformity of detection sensitivity is "D" and evaluation of a visibility is "C", and thus in a case where the conductive member 1 of Comparative Example 2 is used for a touch panel, this touch panel is problematic in practical use.

According to the above examples, it is understood that by using the conductive member of the present invention for a touch panel, a uniformity of detection sensitivity can be improved while ensuring an excellent visibility in the touch panel.

EXPLANATION OF REFERENCES

1: conductive member
2: transparent insulating substrate
2A: front surface
2B: back surface
11, 41: first electrode
12, 42: first main electrode
13, 33: first sub-electrode
14: first external connection terminal
15: first edge part wire
21, 51: second electrode
22, 52: second main electrode
23: second sub-electrode
24: second external connection terminal
25: second edge part wire
Ca, Cb, Cc, Cd: mesh cell
CP1, CP2: composite pattern
D1: first direction
D2: second direction
DM1, DM2, Ma, Mb, Mc, Md: fine metal wire
DP1: first dummy pattern
DP2: second dummy pattern
G1, G2: gap
MF1: first mesh conductive film
MF2: second mesh conductive film
MPa: first conductive mesh pattern
MPb: second conductive mesh pattern
MPc: third conductive mesh pattern
MPd: fourth conductive mesh pattern
Pa, Pb, Pc, Pd: mesh pitch
R: corner portion
Wa, Wb, Wc, Wd: electrode width

What is claimed is:

1. A conductive member for a touch panel, comprising:
a transparent insulating member; and
a plurality of first electrodes extending in a first direction and arranged in parallel in a second direction intersecting the first direction so as to be insulated from one another on the transparent insulating member,
wherein the plurality of first electrodes are constituted by a first mesh conductive film in which a plurality of fine metal wires are electrically connected to one another,
the plurality of first electrodes include a plurality of first main electrodes each having an electrode width Wa defined in the second direction and at least one first sub-electrode having an electrode width Wb smaller than the electrode width Wa of the first main electrode in the second direction,
the first sub-electrode is the first electrode arranged on an outermost side among the plurality of first electrodes,
a ratio of a region not occupied by the fine metal wires on the first sub-electrode of the first mesh conductive film constituting the first sub-electrode is smaller than a ratio of a region not occupied by the fine metal wires on the first main electrode of the first mesh conductive film constituting the first main electrode, and
the first main electrode has a first dummy pattern, which is arranged so as to be electrically insulated from the first mesh conductive film and is constituted by a plurality of fine metal wires.

2. The conductive member for a touch panel according to claim 1,
wherein a difference between an opening ratio of the first main electrode and an opening ratio of the first sub-electrode is within 0.5%.

3. The conductive member for a touch panel according to claim 1, further comprising:
a plurality of first dummy electrodes each of which is arranged between the plurality of first electrodes so as to be electrically insulated from the plurality of first electrodes and each of which is constituted by a plurality of fine metal wires.

4. The conductive member for a touch panel according to claim 3,
wherein a difference between any two of an opening ratio of the first main electrode, an opening ratio of the first sub-electrode, and an opening ratio of the first dummy electrode is within 0.5%, respectively.

5. The conductive member for a touch panel according to claim 1, further comprising:
a plurality of second electrodes extending in the second direction and arranged in parallel in the first direction so as to be insulated from one another,
wherein the plurality of first electrodes and the plurality of second electrodes are arranged so as to be insulated from each other,
wherein the plurality of second electrodes are constituted by a second mesh conductive film in which a plurality of fine metal wires are electrically connected to one another,
wherein the plurality of second electrodes include a plurality of second main electrodes each having an electrode width Wc defined in the first direction and at least one second sub-electrode having an electrode width Wd smaller than the electrode width Wc of the second main electrode in the first direction,
the second sub-electrode is the second electrode arranged on an outermost side among the plurality of second electrodes,
a ratio of a region not occupied by the fine metal wires on the second sub-electrode of the second mesh conductive film constituting the second sub-electrode is smaller than a ratio of a region not occupied by the fine metal wires on the second main electrode of the second mesh conductive film constituting the second main electrode, and
the second main electrode has a second dummy pattern, which is arranged so as to be electrically insulated from the second mesh conductive film and is constituted by a plurality of fine metal wires.

6. The conductive member for a touch panel according to claim 5,
wherein a difference between an opening ratio of the first main electrode and an opening ratio of the first sub-electrode is within 0.5%.

7. The conductive member for a touch panel according to claim 5,
wherein a difference between an opening ratio of the second main electrode and an opening ratio of the second sub-electrode is within 0.5%.

8. The conductive member for a touch panel according to claim 5, further comprising:
a plurality of second dummy electrodes each of which is arranged between the plurality of second electrodes so as to be electrically insulated from the plurality of second electrodes and each of which is constituted by a plurality of fine metal wires.

9. The conductive member for a touch panel according to claim 5,
wherein a difference between an opening ratio of the first main electrode and an opening ratio of the first sub-electrode is within 0.5%, and
a difference between an opening ratio of the second main electrode and an opening ratio of the second sub-electrode is within 0.5%.

10. The conductive member for a touch panel according to claim 5, further comprising:
a plurality of first dummy electrodes each of which is arranged between the plurality of first electrodes so as to be electrically insulated from the plurality of first electrodes and each of which is constituted by a plurality of fine metal wires, and
a plurality of second dummy electrodes each of which is arranged between the plurality of second electrodes so as to be electrically insulated from the plurality of second electrodes and each of which is constituted by a plurality of fine metal wires.

11. The conductive member for a touch panel according to claim 5, further comprising:
a plurality of first dummy electrodes each of which is arranged between the plurality of first electrodes so as to be electrically insulated from the plurality of first electrodes and each of which is constituted by a plurality of fine metal wires, and
a plurality of second dummy electrodes each of which is arranged between the plurality of second electrodes so as to be electrically insulated from the plurality of second electrodes and each of which is constituted by a plurality of fine metal wires,
wherein a difference between an opening ratio of the first main electrode and an opening ratio of the first sub-electrode is within 0.5%.

12. The conductive member for a touch panel according to claim 5, further comprising:
a plurality of first dummy electrodes each of which is arranged between the plurality of first electrodes so as to be electrically insulated from the plurality of first electrodes and each of which is constituted by a plurality of fine metal wires, and
a plurality of second dummy electrodes each of which is arranged between the plurality of second electrodes so as to be electrically insulated from the plurality of second electrodes and each of which is constituted by a plurality of fine metal wires,
wherein a difference between any two of an opening ratio of the first main electrode, an opening ratio of the first sub-electrode, and an opening ratio of the first dummy electrode is within 0.5%, respectively, and
a difference between any two of an opening ratio of the second main electrode, an opening ratio of the second sub-electrode, and an opening ratio of the second dummy electrode is within 0.5%, respectively.

13. A touch panel using the conductive member for a touch panel according to claim 1.

* * * * *